(12) United States Patent
Assefa et al.

(10) Patent No.: US 8,637,335 B1
(45) Date of Patent: Jan. 28, 2014

(54) PHOTONIC MODULATOR WITH A SEMICONDUCTOR CONTACT

(75) Inventors: Solomon Assefa, Ossining, NY (US); William M. J. Green, Astoria, NY (US); Marwan H. Khater, Astoria, NY (US); Yurii A. Vlasov, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/586,187

(22) Filed: Aug. 15, 2012

Related U.S. Application Data

(63) Continuation of application No. 13/561,738, filed on Jul. 30, 2012, now Pat. No. 8,525,264.

(51) Int. Cl.
*H01L 21/00* (2006.01)

(52) U.S. Cl.
USPC ................................. 438/31; 257/E21.538

(58) Field of Classification Search
USPC .............................. 438/36, 37; 257/E21.535
See application file for complete search history.

(56) References Cited

U.S. PATENT DOCUMENTS

| | | | |
|---|---|---|---|
| 6,696,741 B1 | 2/2004 | Ronsisvalle et al. | |
| 6,846,727 B2 | 1/2005 | Fogel et al. | |
| 7,098,090 B2 * | 8/2006 | Zia et al. | 438/155 |
| 7,139,448 B2 * | 11/2006 | Jain et al. | 385/14 |
| 7,811,844 B2 | 10/2010 | Carothers et al. | |
| 7,847,353 B2 | 12/2010 | Hill et al. | |
| 7,955,887 B2 | 6/2011 | Assefa et al. | |
| 2008/0079123 A1 | 4/2008 | Kostrzewa et al. | |
| 2011/0133281 A1 | 6/2011 | Assefa et al. | |

OTHER PUBLICATIONS

Notice of Allowance dated Apr. 30, 2013, received in a related U.S. Patent Application, namely U.S. Appl. No. 13/561,738.
Dong, Y. et al., "Fabrication of High Qaulity Patterned SOI Materials by Optimized Low-dose SIMOX" IEEE International SOI Conference Proceedings (Oct. 4-7, 2004) pp. 60-61.
Liu, A. et al., "Silicon Photonic Integration for High-Speed Applications" Proceedings of SPIE, Silicon Photonics III (Feb. 13, 2008) pp. 68980D-1-68980D-10, vol. 6898.

* cited by examiner

*Primary Examiner* — Chandra Chaudhari
(74) *Attorney, Agent, or Firm* — Scully, Scott, Murphy & Presser; Vazken Alexanian

(57) ABSTRACT

A semiconductor structure includes a photonic modulator and a field effect transistor on a same substrate. The photonic modulator includes a modulator semiconductor structure and a semiconductor contact structure employing a same semiconductor material as a gate electrode of a field effect transistor. The modulator semiconductor structure includes a lateral p-n junction, and the semiconductor contact structure includes another lateral p-n junction. To form this semiconductor structure, the modulator semiconductor structure in the shape of a waveguide and an active region of a field effect transistor region can be patterned in a semiconductor substrate. A gate dielectric layer is formed on the modulator semiconductor structure and the active region, and is subsequently removed from the modulator semiconductor structure. A semiconductor material layer is deposited, patterned, and doped with patterns to form a gate electrode for the field effect transistor and the semiconductor contact structure for the waveguide.

20 Claims, 15 Drawing Sheets

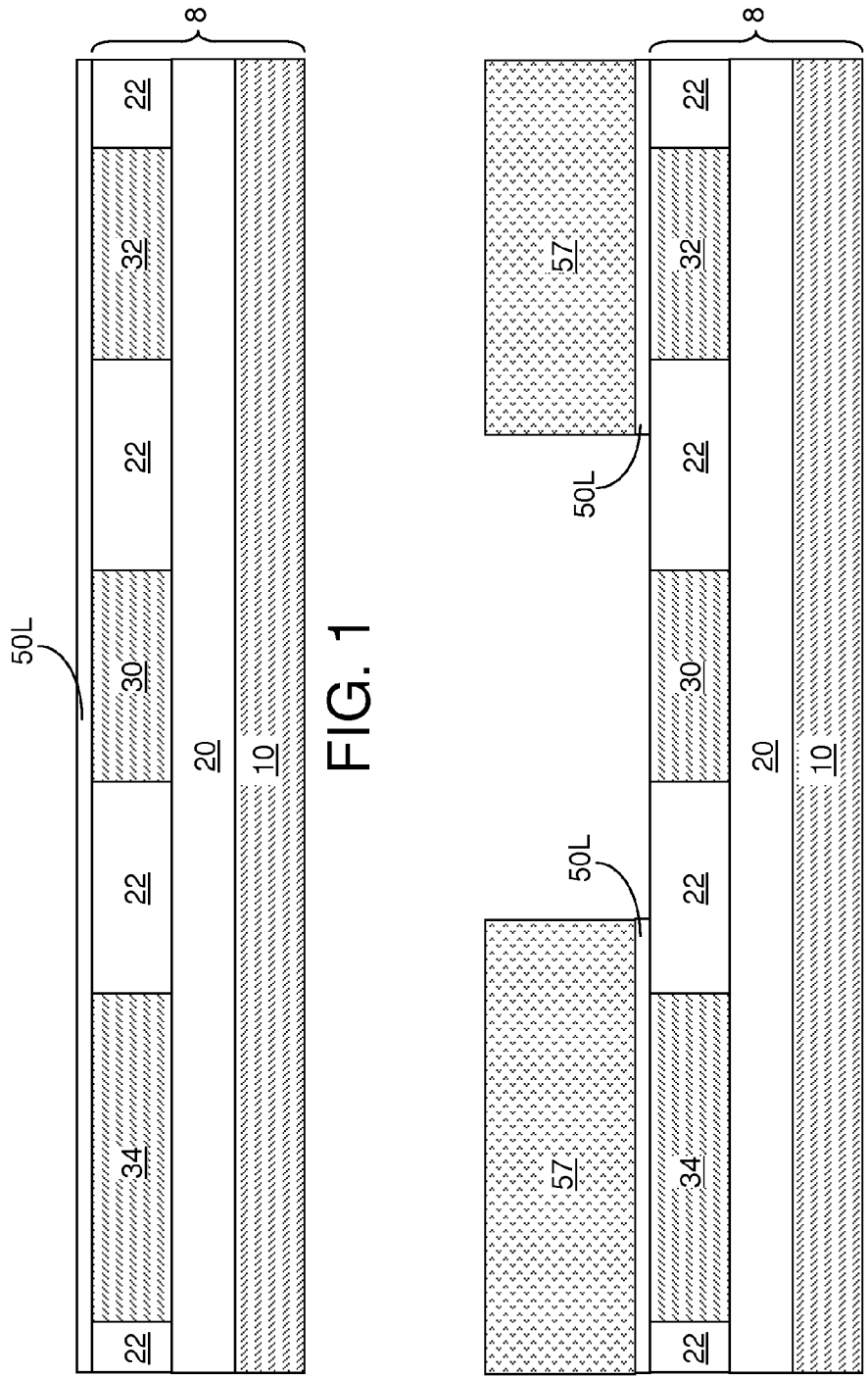

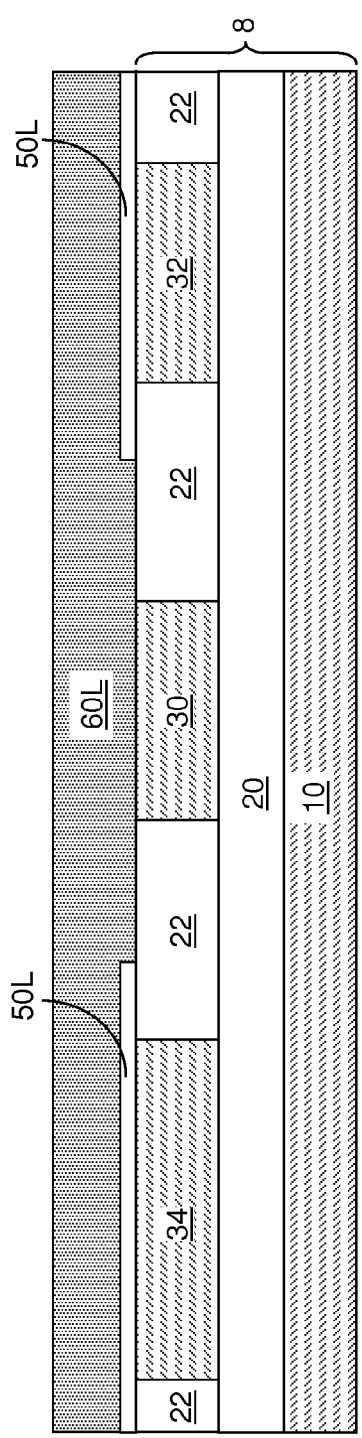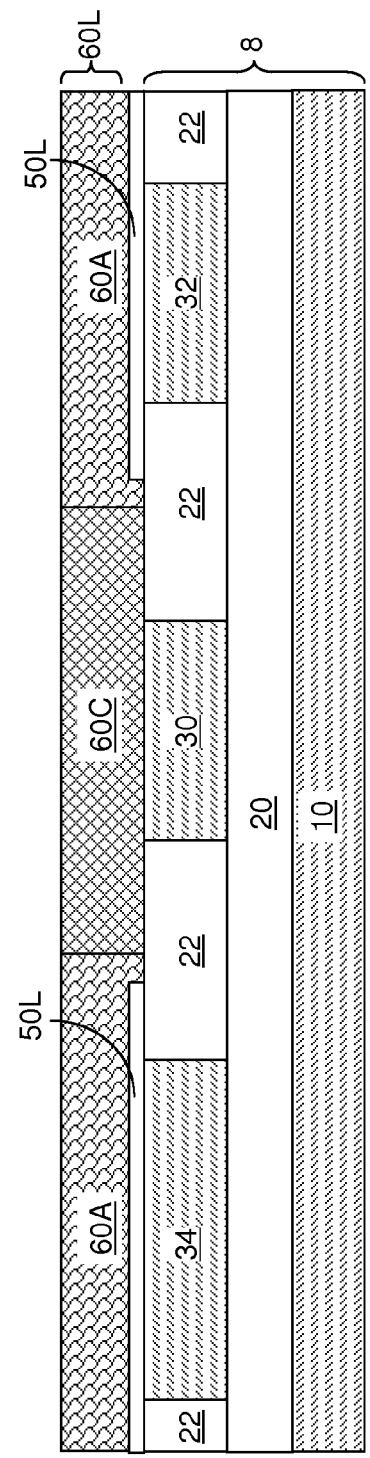

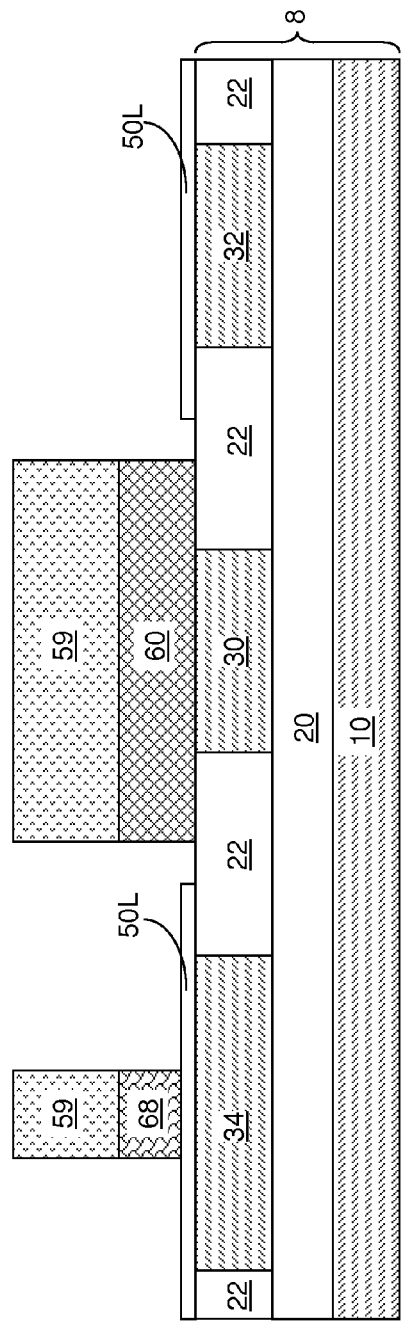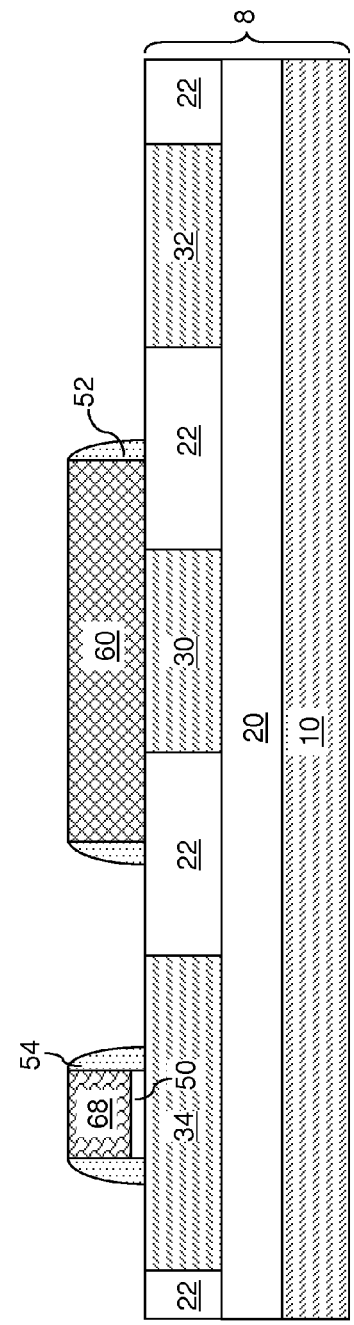

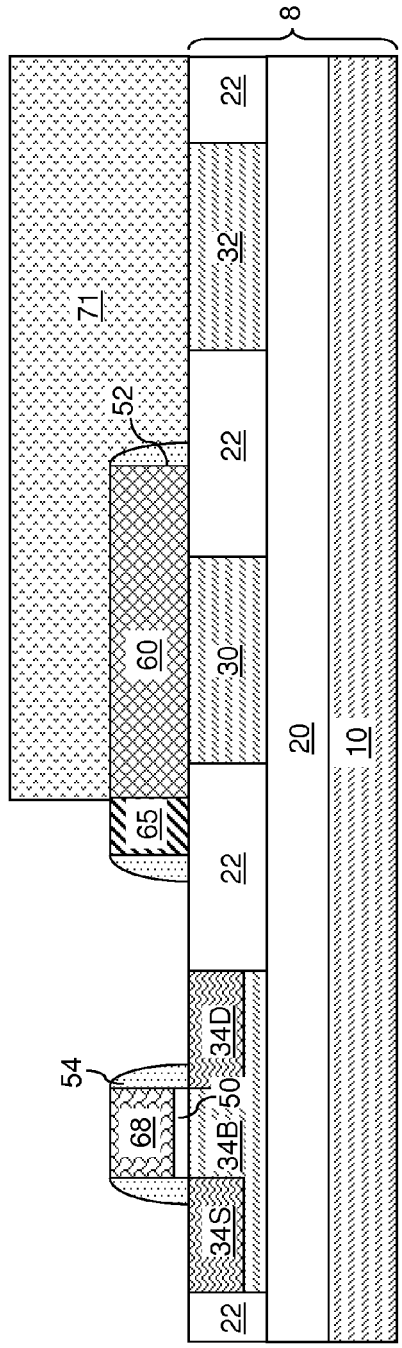
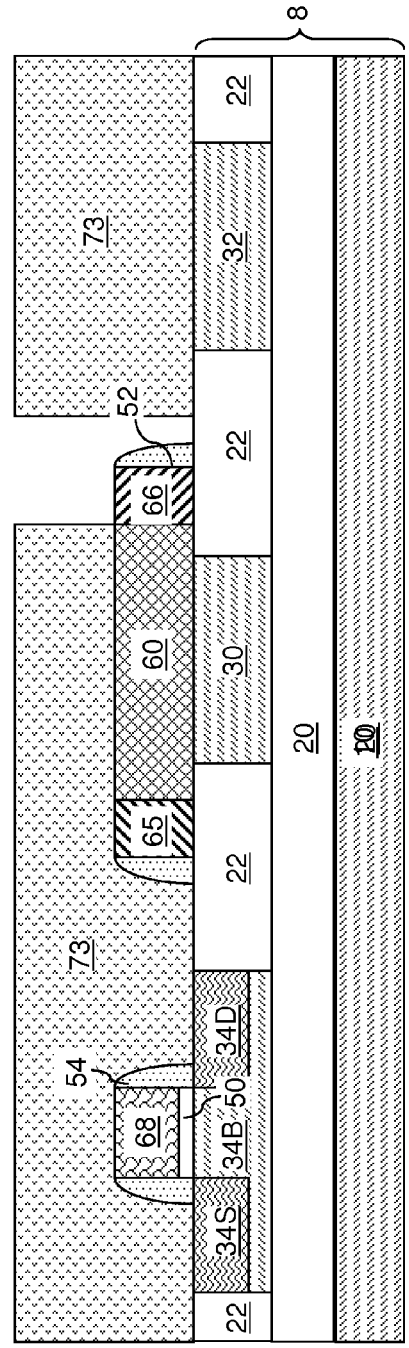

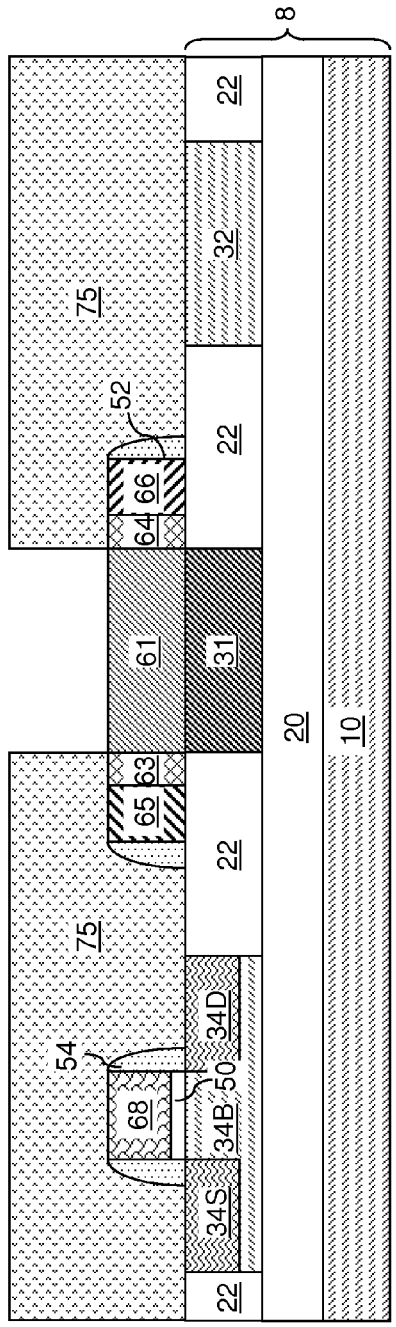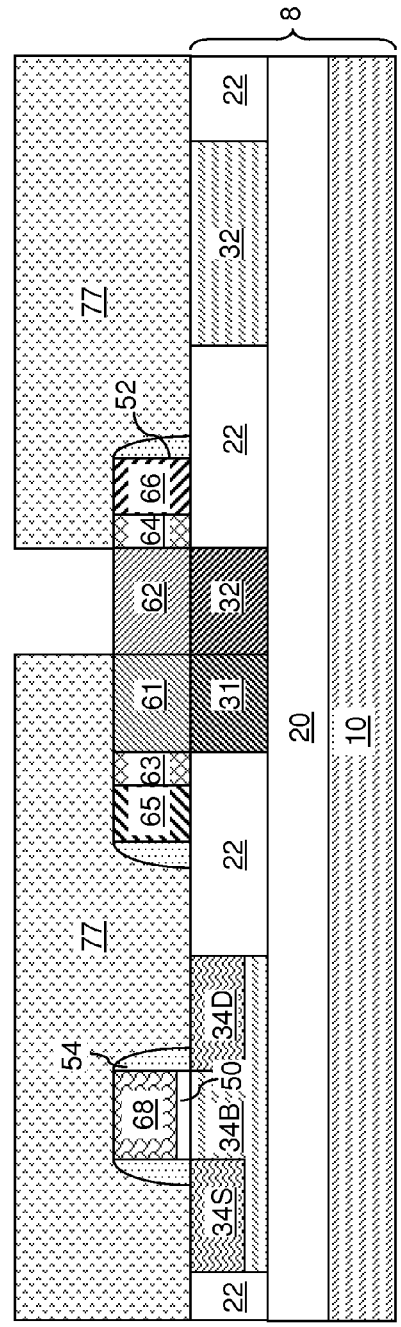

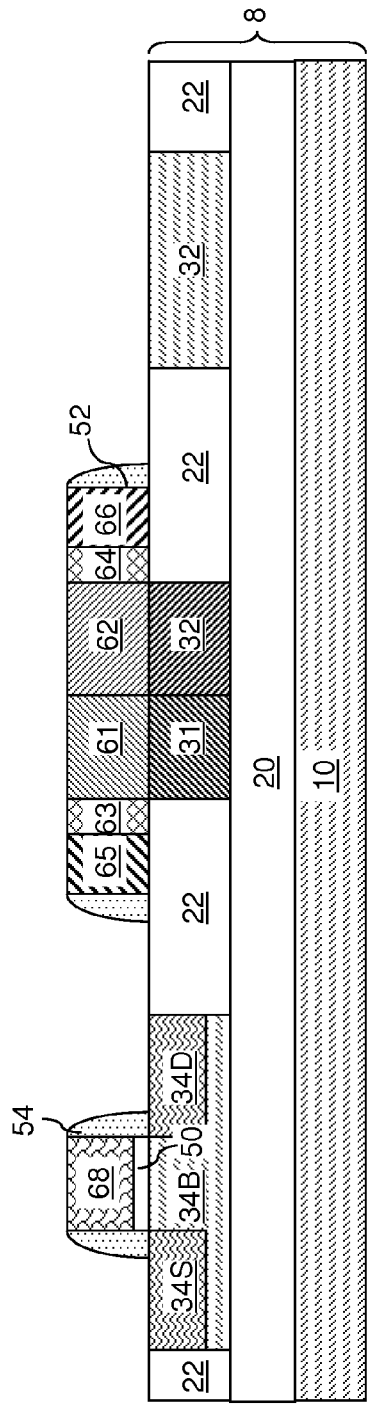
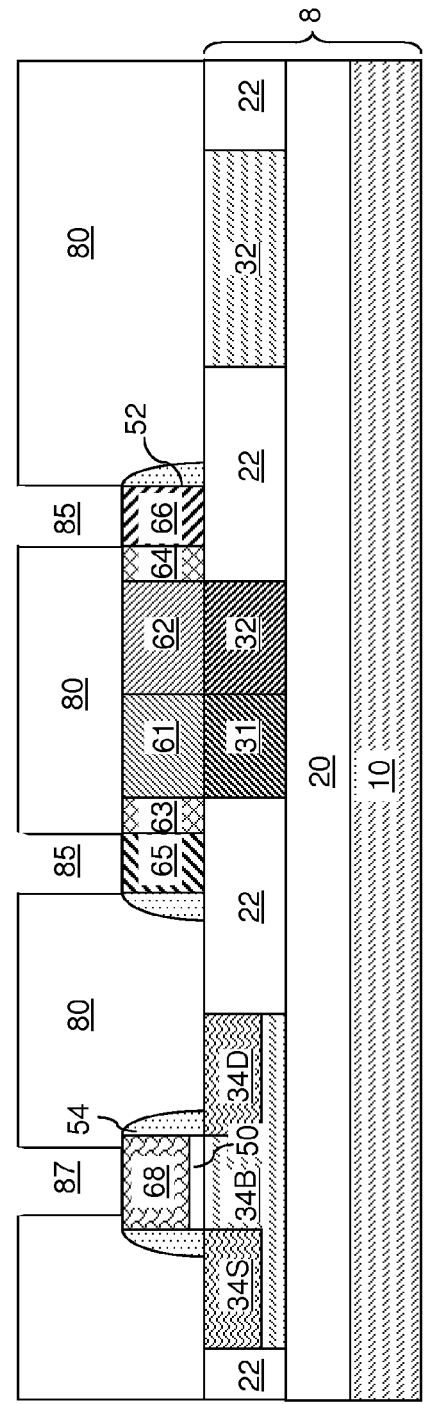
FIG. 11
FIG. 12

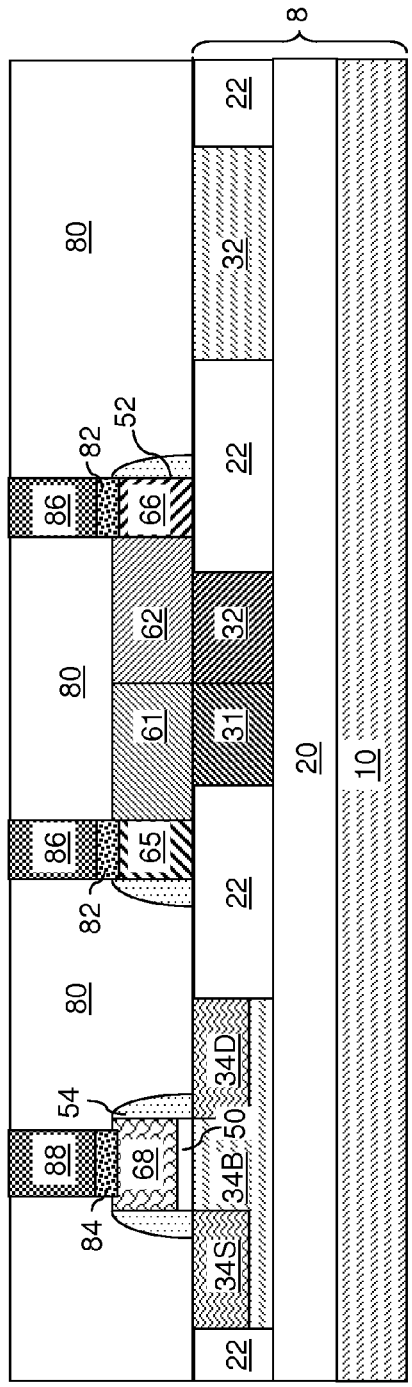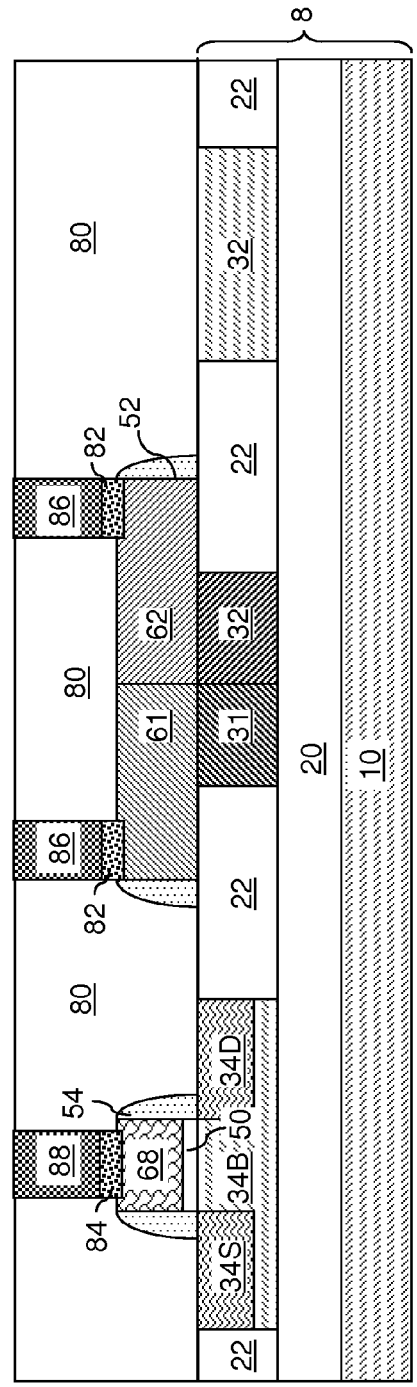

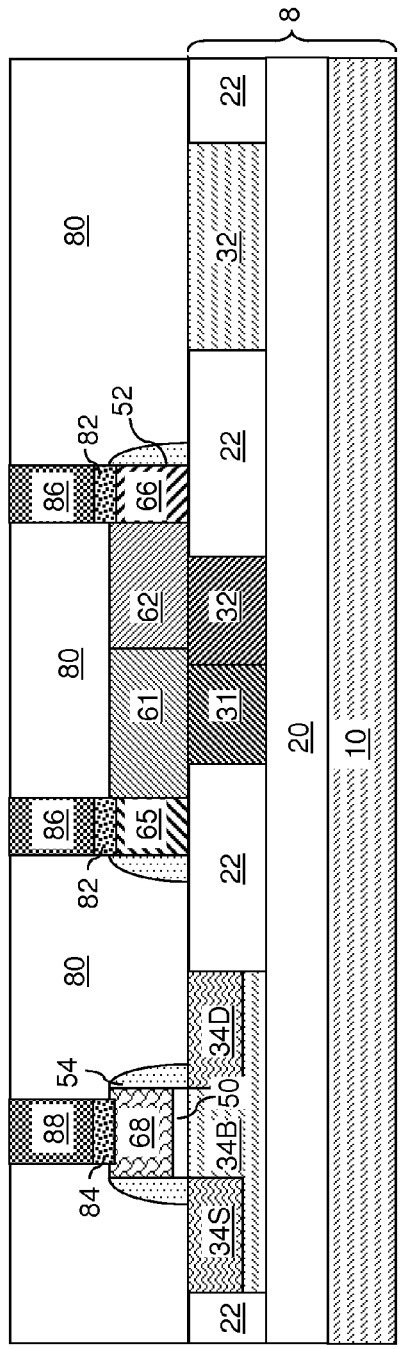
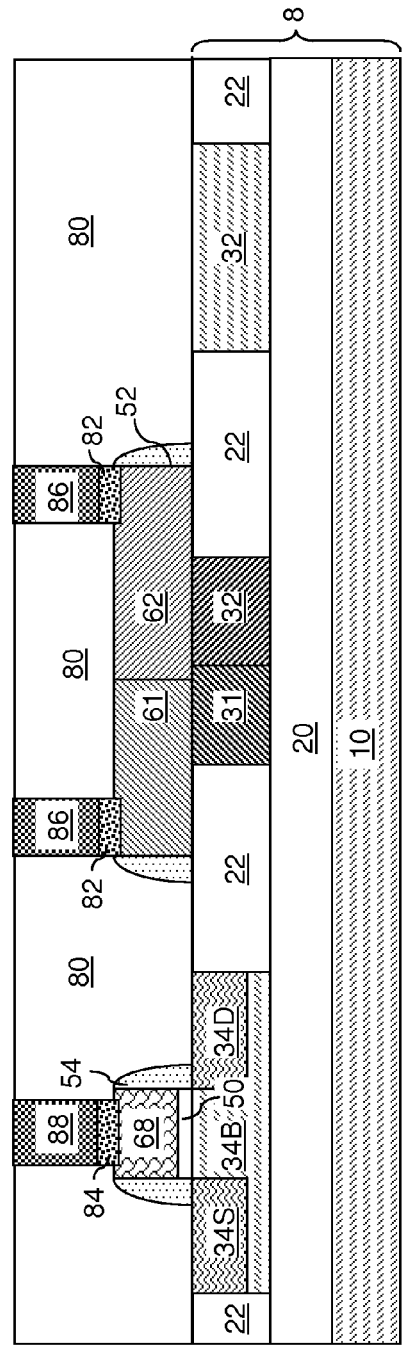
FIG. 17
FIG. 18

PHOTONIC MODULATOR WITH A SEMICONDUCTOR CONTACT

CROSS REFERENCE TO RELATED APPLICATION

This application is a continuation of U.S. patent application Ser. No. 13/561,738, filed Jul. 30, 2012, the entire content and disclosure of which is incorporated herein by reference.

BACKGROUND

The present disclosure relates to a semiconductor structure, and particularly to a photonic modulator having a contact structure employing a same semiconductor material as a gate electrode of a field effect transistor, and methods of manufacturing the same.

A semiconductor waveguide may be employed in microphotonic devices to enable high efficiency long range transmission of light over distances in the micrometer range or in the millimeter range. The semiconductor waveguide typically employs a single crystalline semiconductor material to minimize signal loss due to absorption of light. The semiconductor material in the semiconductor waveguide has a relative high refractive index. For example, silicon and germanium have a refractive index of about 3.45 and about 4.0, respectively. A dielectric material having a lower refractive constant surrounds the semiconductor waveguide so that a total reflection condition is satisfied at the interface between the semiconductor waveguide and the dielectric material for light impinging on the interface at a glancing angle. The semiconductor wave guide may thus be employed to transmit light having a wavelength greater than the wavelength corresponding to the band gap of the semiconductor material. Typically, infrared lights are employed in the semiconductor waveguide.

Many microphotonic devices manipulate the light in the semiconductor waveguide in some way. For example, the light in the semiconductor waveguide may be absorbed, reflected, or induced to change the phase. One method of manipulate the signal in a waveguide is to add a photonic modulator. Addition of the photonic modulator enables change of the phase of the optical signal traveling through the modulator at a different rate per traveling distance than the phase of the optical signal traveling through a waveguide without phase modulation capability.

Integrating photonic components (i.e., waveguides and modulators) with complementary metal semiconductor oxide (CMOS) and bipolar complementary metal semiconductor oxide technologies on silicon substrates can enable on-chip and chip-to-chip optical interconnects. However, integrating photonic components and CMOS and BiCMOS circuitry has been a challenge because different processing steps need to be integrated into a manufacturing process sequence. A method of efficiently integrating manufacturing steps to minimize the number of processing steps and to reduce the processing time and cost is therefore desired.

BRIEF SUMMARY

A semiconductor structure includes a photonic modulator and a field effect transistor on a same substrate. The photonic modulator includes a modulator semiconductor structure and a semiconductor contact structure employing a same semiconductor material as a gate electrode of a field effect transistor. The modulator semiconductor structure includes a lateral p-n junction, and the semiconductor contact structure includes another lateral p-n junction. To form this semiconductor structure, the modulator semiconductor structure in the shape of a waveguide and an active region of a field effect transistor region can be patterned in a semiconductor substrate. A gate dielectric layer is formed on the modulator semiconductor structure and the active region, and is subsequently removed from the modulator semiconductor structure. A semiconductor material layer is deposited, patterned, and doped with patterns to form a gate electrode for the field effect transistor and the semiconductor contact structure for the waveguide.

According to an aspect of the present disclosure, a semiconductor structure is provided, which includes a photonic modulator located on a semiconductor substrate. The photonic modulator includes: a modulator semiconductor structure located within the semiconductor substrate, having a uniform width and a uniform thickness, having sidewalls and a bottom surface contacting at least one dielectric material, and having a first lateral p-n junction between a p-doped modulator semiconductor portion thereof and an n-doped modulator semiconductor portion thereof; and a semiconductor contact structure overlying the semiconductor substrate and having a second lateral p-n unction between a p-doped semiconductor contact portion and an n-doped semiconductor contact portion, wherein the p-doped semiconductor contact portion is in contact with the p-doped modulator semiconductor portion and the n-doped semiconductor contact portion is in contact with the n-doped modulator semiconductor portion.

According to another aspect of the present disclosure, a method of forming a semiconductor structure is provided. The method includes: forming a modulator semiconductor structure having a uniform width and a uniform thickness and having sidewalls and a bottom surface contacting at least one dielectric material in a semiconductor substrate; forming a first lateral p-n junction within the modulator semiconductor structure by forming a p-doped modulator semiconductor portion and an n-doped modulator semiconductor portion within the modulator semiconductor structure; forming a semiconductor contact structure over the semiconductor substrate and directly on the modulator semiconductor structure; and forming a second lateral p-n unction within the semiconductor contact structure by forming a p-doped semiconductor contact portion and an n-doped semiconductor contact portion within the semiconductor contact structure, wherein the p-doped semiconductor contact portion is in contact with the p-doped modulator semiconductor portion upon formation of the p-doped semiconductor contact portion, and the n-doped semiconductor contact portion is in contact with the n-doped modulator semiconductor portion upon formation of the n-doped semiconductor contact portion.

BRIEF DESCRIPTION OF SEVERAL VIEWS OF THE DRAWINGS

FIG. 1 is a vertical cross-sectional view of a first exemplary semiconductor structure after formation of an active region for a field effect transistor, a modulator semiconductor structure, and a waveguide semiconductor structure and formation of a gate dielectric layer according to a first embodiment of the present disclosure.

FIG. 2 is a vertical cross-sectional view of the first exemplary semiconductor structure after removal of a portion of the gate dielectric layer from above the modulator semiconductor structure according to the first embodiment of the present disclosure.

FIG. 3 is a vertical cross-sectional view of the first exemplary semiconductor structure after deposition of a blanket semiconductor material layer according to the first embodiment of the present disclosure.

FIG. 4 is a vertical cross-sectional view of the first exemplary semiconductor structure after an optional annealing according to the first embodiment of the present disclosure.

FIG. 5 is a vertical cross-sectional view of the first exemplary semiconductor structure after patterning of the semiconductor material of the blanket semiconductor material layer to form a gate electrode and a semiconductor contact structure according to the first embodiment of the present disclosure.

FIG. 6 is a vertical cross-sectional view of the first exemplary semiconductor structure after formation of a dielectric spacer according to an embodiment of the present disclosure.

FIG. 7 is a vertical cross-sectional view of the first exemplary semiconductor structure after doping of a first end portion of the semiconductor contact structure with first conductivity type dopants to form a first conductivity type-doped end portion according to the first embodiment of the present disclosure.

FIG. 8 is a vertical cross-sectional view of the first exemplary semiconductor structure after doping of a second end portion of the semiconductor contact structure to form a second conductivity type-doped end portion according to the first embodiment of the present disclosure.

FIG. 9 is a vertical cross-sectional view of the first exemplary semiconductor structure after doping of a center portion of the semiconductor contact structure with first conductivity type dopants to form a first conductivity type-doped semiconductor contact portion and after doping of the modulator semiconductor structure to form a first conductivity type-doped modulator semiconductor portion according to the first embodiment of the present disclosure.

FIG. 10 is a vertical cross-sectional view of the first exemplary semiconductor structure after doping of a sub-portion of the center portion of the semiconductor contact structure with second conductivity type dopants to form a second conductivity type-doped semiconductor contact portion, and after doping of a portion of the modulator semiconductor structure to form a second conductivity type-doped modulator semiconductor portion according to the first embodiment of the present disclosure.

FIG. 11 is a vertical cross-sectional view of the first exemplary semiconductor structure after removal of an implantation mask layer according to the first embodiment of the present disclosure.

FIG. 12 is a vertical cross-sectional view of the first exemplary semiconductor structure after formation of a contact-level dielectric material layer and formation of various contact via holes within the contact-level dielectric material layer according to the first embodiment of the present disclosure.

FIG. 15 is a vertical cross-sectional view of a second exemplary semiconductor structure according to a second embodiment of the present disclosure.

FIG. 16 is a vertical cross-sectional view of a third exemplary semiconductor structure according to a third embodiment of the present disclosure.

FIG. 17 is a vertical cross-sectional view of a fourth exemplary semiconductor structure according to a fourth embodiment of the present disclosure.

FIG. 18 is a vertical cross-sectional view of a fifth exemplary semiconductor structure according to a fifth embodiment of the present disclosure.

DETAILED DESCRIPTION

Figure 6A:
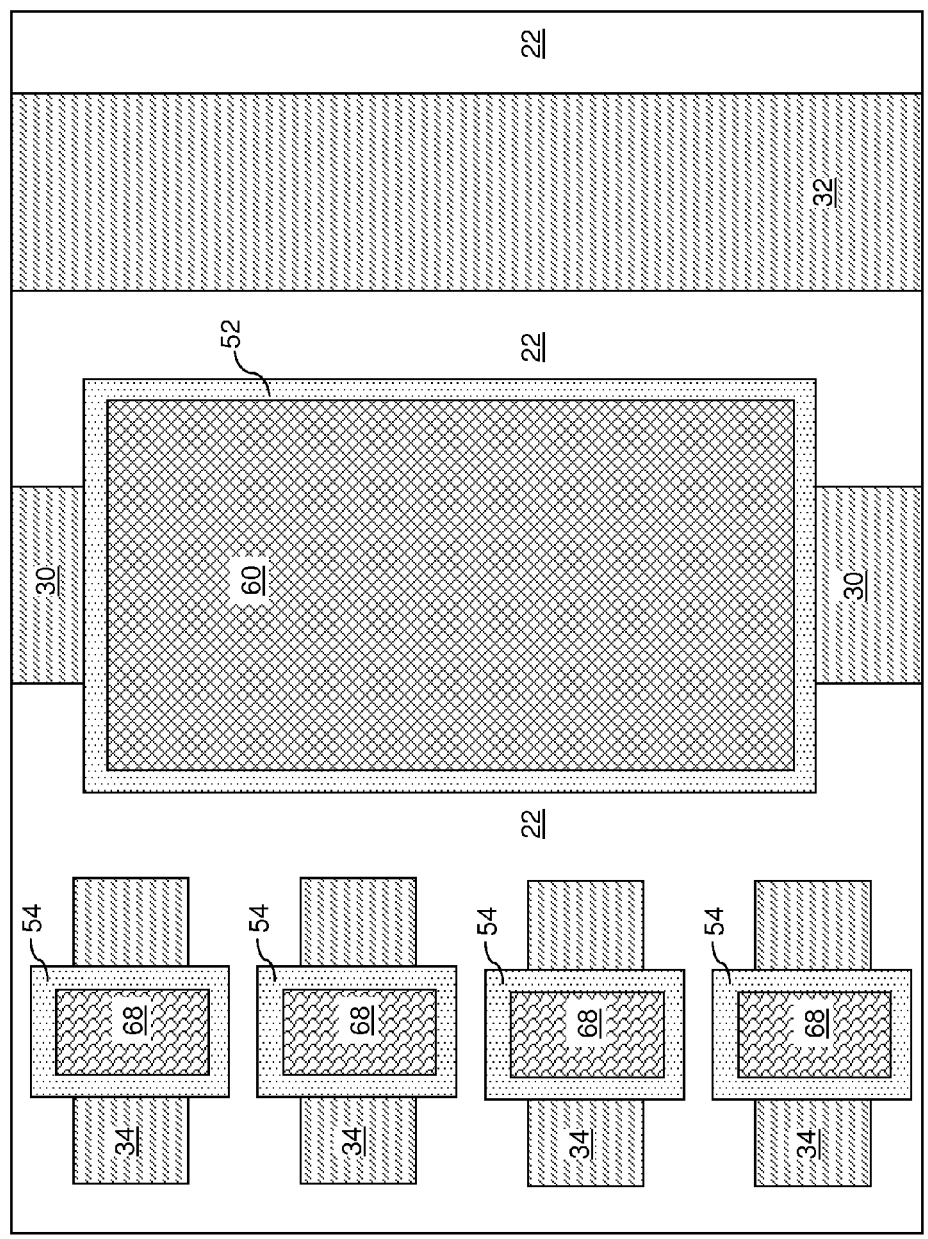
FIG. 6A is a top-down view of the first exemplary semiconductor structure of FIG. 6.

As stated above, the present disclosure relates to a photonic modulator having a contact structure employing a same semiconductor material as a gate electrode of a field effect transistor, and methods of manufacturing the same, which are now described in detail with accompanying figures. Throughout the drawings, the same reference numerals or letters are used to designate like or equivalent elements. The drawings are not necessarily drawn to scale.

Referring to FIG. 1, a first exemplary semiconductor structure according to a first embodiment of the present disclosure includes a semiconductor substrate 8. The semiconductor substrate 8 can be a semiconductor-on-insulator (SOI) substrate including a vertical stack of a handle substrate 10, a buried insulator layer 20, and a top semiconductor layer including a semiconductor material. The handle substrate 10 may comprise a semiconductor material, an insulator material, a conductive material, or a combination thereof. The buried insulator layer 20 includes a dielectric material such as a dielectric oxide, a dielectric nitride, and/or a dielectric oxynitride. For example, the buried insulator layer 20 can include silicon oxide.

At least one shallow trench isolation structure 22 can be formed by substituting portions of the top semiconductor layer with a dielectric material such as silicon oxide, silicon nitride, silicon oxynitride, or a combination thereof employing methods known in the art. The remaining portions of the top semiconductor layer are separated into a plurality of disjoined semiconductor material portions laterally spaced from one another at least by the at least one shallow trench isolation structure 22. The remaining portions of the top semiconductor layer can include, for example, a modulator semiconductor structure 30 (i.e., a semiconductor structure that is employed for a modulator) that subsequently forms a portion of a photonic modulator, a waveguide semiconductor structure 32, and an active region 34 which subsequently forms a body region, a source region, and a drain region of a field effect transistor.

The semiconductor material that can be employed for the top semiconductor layer, and consequently, for the modulator semiconductor structure 30, the waveguide semiconductor structure 32, and the active region 34 includes, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The semiconductor material of the modulator semiconductor structure 30, the waveguide semiconductor structure 32, and the active region 34 can be single crystalline, polycrystalline, or amorphous. In one embodiment, the semiconductor material of the modulator semiconductor structure 30, the waveguide semiconductor structure 32, and the active region 34 can be single crystalline can be a single crystalline semiconductor material. In one embodiment, the semiconductor material of the modulator semiconductor structure 30, the waveguide semiconductor structure 32, and the active region 34 can be single crystalline is single crystalline silicon.

The semiconductor material of the modulator semiconductor structure 30, the waveguide semiconductor structure 32, and the active region 34 can be intrinsic or lightly doped. For example, semiconductor material of the modulator semiconductor structure 30 can be substantially free of p-type dopants or n-type dopants, or can include p-type dopants or n-type dopants. In one embodiment, the modulator semiconductor structure 30, the waveguide semiconductor structure 32, and the active region 34 can be independently doped with p-type dopants or n-type dopants. Further, dopant concentration in each of the modulator semiconductor structure 30, the waveguide semiconductor structure 32, and the active region 34 can be independently controlled. In one embodiment, the waveguide semiconductor structure 32 is intrinsic, or is doped with p-type dopants or n-type dopants.

In one embodiment, the modulator semiconductor structure 30 has a uniform width and a uniform thickness along the direction perpendicular to the plane of the vertical cross-sectional view of FIG. 1. In this case, the sidewalls of the modular semiconductor structure 30 are laterally spaced by the uniform width, and laterally contact the at least one shallow trench isolation structure 22. Further, the bottom surface of the modulator semiconductor structure 30 contacts the top surface of the buried insulator layer 20. The width of the modulator semiconductor structure 30 depends on the permittivity of the semiconductor material of the modulator semiconductor structure 30 and the wavelength of the optical signal to be transmitted along the lengthwise direction of the modulator semiconductor structure 30, i.e., in the direction perpendicular to the vertical cross-sectional view of FIG. 1, and can be from 300 nm to 6,000 nm, although lesser and greater widths can also be employed. The depth of the modulator semiconductor structure 30 depends on the permittivity of the semiconductor material of the modulator semiconductor structure 30 and the wavelength of the optical signal to be transmitted along the lengthwise direction of the modulator semiconductor structure 30, i.e., in the direction perpendicular to the vertical cross-sectional view of FIG. 1, and can be from 100 nm to 6,000 nm, although lesser and greater widths can also be employed.

In one embodiment, the waveguide semiconductor structure 32 has a uniform width and a uniform thickness along the direction perpendicular to the plane of the vertical cross-sectional view of FIG. 1. In this case, the sidewalls of the waveguide semiconductor structure 32 are laterally spaced by the uniform width, and laterally contact the at least one shallow trench isolation structure 22. Further, the bottom surface of the waveguide semiconductor structure 32 contacts the top surface of the buried insulator layer 20. The width of the waveguide semiconductor structure 32 depends on the permittivity of the semiconductor material of the waveguide semiconductor structure 32 and the wavelength of the optical signal to be transmitted along the lengthwise direction of the waveguide semiconductor structure 32, i.e., in the direction perpendicular to the vertical cross-sectional view of FIG. 1, and can be from 300 nm to 6,000 nm, although lesser and greater widths can also be employed. The depth of the waveguide semiconductor structure 32 depends on the permittivity of the semiconductor material of the waveguide semiconductor structure 32 and the wavelength of the optical signal to be transmitted along the lengthwise direction of the modulator semiconductor structure 30, i.e., in the direction perpendicular to the vertical cross-sectional view of FIG. 1, and can be from 100 nm to 6,000 nm, although lesser and greater widths can also be employed. If optical signals of the same wavelength are to be transmitted through the modulator semiconductor structure 30 and the waveguide semiconductor structure 32, the widths of the modulator semiconductor structure 30 and the waveguide semiconductor structure 32 can be the same. In one embodiment, the depths of the modulator semiconductor structure 30 and the waveguide semiconductor structure 32 can be the same.

The active region 34 can be doped with p-type dopants or n-type dopants at a dopant concentration for a body region of the field effect transistor to be formed. The doping of the active region 34 can be performed, for example, by masked ion implantation.

A gate dielectric layer 50L is formed on the top surfaces of the modulator semiconductor structure 30, the waveguide semiconductor structure 32, and the active region 34. In one embodiment, the gate dielectric layer 50L can include a blanket layer (i.e., an unpatterned layer) that is deposited on the entirety of the top surface of the modulator semiconductor structure 30, the waveguide semiconductor structure 32, the active region 34, and the at least one shallow trench isolation structure 22. For example, the gate dielectric layer 50L can include a dielectric metal oxide layer having a dielectric metal oxide having a dielectric constant greater than 7.9, which is commonly known as a high-k gate dielectric material. Alternately or additionally, the gate dielectric layer 50L can include a dielectric material that is selectively formed on semiconductor surfaces and not formed on dielectric surfaces. For example, the gate dielectric layer 50L can include a thermal oxide of the modulator semiconductor structure 30, the waveguide semiconductor structure 32, and the active region 34, which is formed only on the physically exposed semiconductor surfaces of the modulator semiconductor structure 30, the waveguide semiconductor structure 32, and the active region 34, and not formed on the surfaces of the at least one shallow trench isolation structure 22. The thickness of the gate dielectric layer 50L can be from 1 nm to 10 nm, although lesser and greater thicknesses can also be employed.

Referring to FIG. 2, a photoresist layer 57 is applied over the gate dielectric layer 50L, and is lithographically patterned to form at least one opening overlying at least a portion of the modulator semiconductor structure 30. Thus, the width of each opening in the photoresist layer 57 along the widthwise direction of the modulator semiconductor structure 30 is greater than the width of the modulator semiconductor structure 30. The physically exposed portion of the gate dielectric layer 50L is etched, for example, by a wet etch or a dry etch, forming at least one opening in the gate dielectric layer 50L having the same shape as the at least one opening in the photoresist layer 57. The top surface of the modulator semiconductor structure 30 is physically exposed within each opening in the gate dielectric layer 50L. In one embodiment, the gate dielectric layer 50L is not removed from above the active region 34 or from above the waveguide semiconductor region 32.

In one embodiment, the entire top surface of the modulator semiconductor structure 30 can be physically exposed. In this case, the entirety of the sidewalls of an opening in the photoresist layer 57 overlies the at least one shallow trench isolation structure 22.

In another embodiment, at least one opening in the photoresist layer 57 laterally straddles a portion of the modulator semiconductor structure 30. The entirety of the sidewalls of each of the at least one opening in the photoresist layer 57 overlies the modulator semiconductor structure 30 or at least one shallow trench isolation structure 22 that is in lateral contact with the modulator semiconductor structure 30. In one embodiment, the shape of each opening in the photoresist layer 57 can be rectangular. The dimension of each opening along the lengthwise direction of the modulator semiconductor structure 30 can be from 50 microns to 10 mm, although lesser and greater dimensions can also be employed. In one embodiment, a plurality of openings are formed in the photoresist layer 57, and the pitch of the openings can be from 100 microns to 20 mm, although lesser and greater pitches can also be employed.

Referring to FIG. 3, a semiconductor material layer 60L is deposited over the patterned gate dielectric layer 50L as a blanket (unpatterned) layer, for example, by chemical vapor deposition. The semiconductor material layer 60L is deposited directly on the patterned gate electrode layer 50L and physically exposed top surface(s) of the modulator semiconductor structure 30.

The semiconductor material layer 60L can be doped as an intrinsic semiconductor material layer or as a doped semiconductor material layer. Further, various portions of the semiconductor material layer 60L can be independently doped with dopants of various conductivity types (i.e., p-type or n-type) at various dopant concentrations. While the present disclosure is described employing an embodiment in which a portion of the semiconductor material layer 60L overlying the modulator semiconductor structure 30 is doped in separate masked ion implantation steps after patterning of the semiconductor material layer, embodiments are contemplated herein in which the various ion implantation steps for the portion of the semiconductor material layer 60L overlying the modulator semiconductor structure 30 is performed fully or partly prior to patterning of the semiconductor material layer 60L.

In one embodiment, the semiconductor material layer 60L is deposited as a polycrystalline semiconductor material layer. For example, the semiconductor material layer 60L can be a polysilicon layer, a polycrystalline silicon-germanium alloy layer, or any other polycrystalline semiconductor material layer.

In another embodiment, the semiconductor material layer 60L is deposited as an amorphous semiconductor material layer. In this embodiment, the semiconductor material layer 60L can include any amorphous semiconductor material including, but not limited to, amorphous silicon and amorphous silicon-germanium alloy.

In yet another embodiment, epitaxial semiconductor deposition process can be employed to form the semiconductor material layer 60L. In this embodiment, the modulator semiconductor structure 30 can include a first single crystalline semiconductor material, and the semiconductor material layer 60L can include epitaxial semiconductor material portion(s) 60C that is/are in epitaxial alignment with the modulator semiconductor structure 30 as illustrated in FIG. 4. Each epitaxial semiconductor material portion 60C overlies a portion of the modulator semiconductor structure 30 and laterally extend over peripheral portions of the at least one shallow trench isolation structure 22 to the extent the epitaxial alignment laterally propagates from edges of the modulator semiconductor structure 30. The semiconductor material layer 60L may further include polycrystalline semiconductor material portions 60A, which overlie the gate dielectric layer 50L or portions of the at least one shallow trench isolation structure 22 located farther away from the modulator semiconductor structure 30 than the distance by which the epitaxial alignment laterally propagates during the epitaxial semiconductor deposition.

In one embodiment, each epitaxial semiconductor material portion 60C can include single crystalline silicon, and each polycrystalline semiconductor material portions 60A can include polysilicon. In another embodiment, each epitaxial semiconductor material portion 60C can include a single crystalline silicon germanium alloy, and each polycrystalline semiconductor material portions 60A can include a polycrystalline silicon germanium alloy. In yet another embodiment, each epitaxial semiconductor material portion 60C can include any other single crystalline semiconductor material, and each polycrystalline semiconductor material portions 60A can include a polycrystalline semiconductor material having a same composition as the single crystalline semiconductor material.

If the semiconductor material layer 60L is deposited as an amorphous semiconductor material layer, the first exemplary semiconductor structure of FIG. 3 can be annealed at an elevated temperature that induces solid phase epitaxy of the amorphous semiconductor material as known in the art. The solid phase epitaxy process can convert the amorphous semiconductor material layer into a combination of epitaxial semiconductor material portion(s) 60C and polycrystalline semiconductor material portions 60A as illustrated in FIG. 4. In this embodiment, a portion of the amorphous semiconductor material is converted into a second single crystalline semiconductor material in epitaxial alignment with the first single crystalline semiconductor material of the modulator semiconductor structure 30.

While the present disclosure is described employing an embodiment in which a combination of epitaxial semiconductor material portion(s) 60C and polycrystalline semiconductor material portions 60A is formed as, or from, the semiconductor material layer 60L, embodiments are contemplated herein in which the entirety of the semiconductor material layer 60L is polycrystalline. In such embodiments, the epitaxial semiconductor material portion(s) 60C is/are replaced with polycrystalline semiconductor material portion(s).

Referring to FIG. 5, the semiconductor material of the semiconductor material layer 60L is patterned, for example, by application and patterning of a photoresist layer 59 and transfer of the pattern in the photoresist layer into the semiconductor material layer 60L by an etch, which can be an anisotropic etch such as a reactive ion etch or an isotropic etch such as a wet etch. A remaining portion of the semiconductor material layer 60L over the active region 68 constitutes a gate electrode 68 including a polycrystalline semiconductor material. A remaining portion of the semiconductor material layer 60L that contacts the modulator semiconductor structure 30 constitutes a semiconductor contact structure 60, which can include a single crystalline semiconductor material or a polycrystalline semiconductor material. A peripheral portion of a bottom surface of the semiconductor contact structure 60 can be in contact with a top surface of the at least one shallow trench isolation structure 22.

The semiconductor contact structure 60 has the same semiconductor composition, i.e., the same composition except for the species and/or the concentration of p-type dopants or n-type dopants, as the gate electrode 68. If the semiconductor contact structure 60 and the gate electrode 68 are intrinsic or have a doping of the same type and the same concentration, the semiconductor contact structure 60 has the same composition. The photoresist layer 59 is subsequently removed, for example, by ashing.

Referring to FIGS. 6 and 6A, physically exposed portions of the gate dielectric layer 50L is removed, for example, by a wet etch, a reactive ion etch, or a combination thereof. The remaining portion of the gate dielectric layer 50L underneath the gate electrode 68 constitutes a gate dielectric 50.

A dielectric material layer is conformally deposited on the first exemplary semiconductor structure and is subsequently anisotropically etched by an anisotropic etch such as a reactive ion etch. Horizontal portions of the dielectric material layer are removed by the anisotropic etch. A remaining portion of the dielectric material layer in contact with, and laterally surrounding, the sidewalls of the gate electrode 68 constitutes a dielectric gate spacer 54, and a remaining portion of the dielectric material layer in contact with, and laterally surrounding, the sidewalls of the semiconductor contact structure 60 constitutes a dielectric spacer 52. The dielectric gate spacer 54 and the dielectric spacer 52 are formed concurrently during the same processing step, i.e., during the anisotropic etch step. The dielectric spacer 52 has the same composition as the gate dielectric spacer 54. Further, the thickness of dielectric gate pacer 54 as measured at the base thereof, e.g., at the bottommost portion that contacts the active region 34, can be the same as the thickness of the dielectric spacer 52 as measured at the base thereof, e.g., at the bottommost portion that contacts the at least one shallow trench isolation structure 22.

Referring to FIG. 7, a first ion implantation mask layer 71 can be formed and lithographically patterned to physically expose a first end portion of the semiconductor contact structure 60. The first ion implantation mask layer 71 can be a photoresist layer. First conductivity type dopants, which can be p-type dopants or n-type dopants, are implanted into the first end portion of the semiconductor contact structure 60 to form a first conductivity type-doped end portion 65, which can be a p-doped semiconductor region or an n-doped semiconductor region. The first conductivity type-doped end portion 65 may, or may not, be in contact with the modulator semiconductor structure 30. In one embodiment, the first conductivity type-doped end portion 65 is not in contact with the modulator semiconductor structure 30, and is in contact with the at least one shallow trench isolation structure 22.

In one embodiment, the first conductivity type-doped end portion 65 is heavily doped with dopants of the first conductivity type. For example, the concentration of first conductivity type dopants in the first conductivity type-doped end portion 65 can be greater than $3.0\times10^{19}/cm^3$. In one embodiment, the concentration of dopants of the first conductivity type in the first conductivity type-doped end portion 65 can be greater than $3.0\times10^{20}/cm^3$.

In one embodiment, the ion implantation step that forms the first conductivity type-doped end portion 65 can be employed to form additional first conductivity type-doped portions. For example, a source region 34S and a drain region 34D can be formed in the active region 34 by implanting first conductivity type dopants into portions of the active region 34 that are not shielded by the gate electrode 68 or the dielectric gate spacer 54 during the ion implantation that forms the first conductivity type-doped end portion 65. A remaining portion of the active region 34 constitutes a body region 34B of the field effect transistor. In one embodiment, the body region 34B can have a doping of a second conductivity type, which is the opposite type of the first conductivity type. For example, if the first conductivity type is p-type, the second conductivity type is n-type, and vice versa. The first ion implantation mask layer 71 is subsequently removed, for example, by ashing.

Referring to FIG. 8, a second ion implantation mask layer 73 can be formed and lithographically patterned to physically expose a second end portion of the semiconductor contact structure (60, 65). The second ion implantation mask layer 73 can be a photoresist layer. The second end portion of the semiconductor contact structure (60, 65) is located at the opposite side of the first conductivity type-doped end portion 65. Second conductivity type dopants are implanted into the second end portion of the semiconductor contact structure (60, 65) to form a second conductivity type-doped end portion 66. If the first conductivity type-doped end portion 65 is a p-doped semiconductor region, the second conductivity type-doped end portion 66 is an n-doped semiconductor region, and vice versa. The second conductivity type-doped end portion 66 may, or may not, be in contact with the modulator semiconductor structure 30. In one embodiment, the second conductivity type-doped end portion 66 is not in contact with the modulator semiconductor structure 30, and is in contact with the at least one shallow trench isolation structure 22.

In one embodiment, the second conductivity type-doped end portion 66 is heavily doped with dopants of the second conductivity type. For example, the concentration of second conductivity type dopants in the second conductivity type-doped end portion 66 can be greater than $3.0\times10^{19}/cm^3$. In one embodiment, the concentration of dopants of the second conductivity type in the second conductivity type-doped end portion 66 can be greater than $3.0\times10^{20}/cm^3$.

In one embodiment, the ion implantation step that forms the second conductivity type-doped end portion 66 can be employed to form additional second conductivity type-doped portions (not shown). The second ion implantation mask layer 73 is subsequently removed, for example, by ashing.

Referring to FIG. 9, a third ion implantation mask layer 75 can be formed and lithographically patterned to physically expose a center portion of the semiconductor contact structure (60, 65, 66). The third ion implantation mask layer 75 can be a photoresist layer. In one embodiment, the center portion of the semiconductor contact structure (60, 65, 66) can be selected not to include any of the first conductivity type-doped end portion 65 or the second conductivity type-doped end portion 66. In one embodiment, the opening in the third ion implantation mask layer 75 can be selected to laterally extend at least from one sidewall of the modulator semiconductor structure 30 (See FIG. 8) located on one side and at least to another sidewall of the modulator semiconductor structure 30 located on the other side.

First conductivity type ions are implanted into the center portion of the semiconductor contact structure (60, 65, 66) to form a first conductivity type-doped semiconductor contact portion 61. In other words, the implanted center portion of the semiconductor contact structure (60, 65, 66) is converted into the first conductivity type-doped semiconductor contact portion 61. In one embodiment, the first conductivity type-doped semiconductor contact portion 61 can be at least as wide as the width of the modulator semiconductor structure 30.

In one embodiment, the dopant concentration in the first conductivity type-doped semiconductor contact portion 61 can be less than the dopant concentration in the first conductivity type-doped end portion 65. For example, the concentration of first conductivity type dopants in the first conductivity type-doped semiconductor contact portion 61 can be from $1.0 \times 10^{16}/cm^3$ to $1.0 \times 10^{20}/cm^3$. In one embodiment, the concentration of first conductivity type dopants in the first conductivity type-doped semiconductor contact portion 61 can be from $1.0 \times 10^{17}/cm^3$ to $1.0 \times 10^{19}/cm^3$.

In one embodiment, the energy of the ion implantation can be selected to deliver additional first conductivity type dopants into the modulator semiconductor structure 30 (See FIG. 8). In this embodiment, dopants of the first conductivity type can be simultaneously implanted into the modulator semiconductor structure (30; See FIG. 8) and the center portion of the semiconductor contact structure (60, 65, 66; See FIG. 8) at a first dose. At least a portion of the modulator semiconductor structure 30 is converted into a first conductivity type-doped modulator semiconductor portion 31 having a doping of the first conductivity type. In one embodiment, the entirety of the modulator semiconductor structure 30 can be converted into the first conductivity type-doped modulator semiconductor portion 31. The first conductivity type-doped semiconductor contact portion 61 and the first conductivity type-doped modulator semiconductor portion 31 can be formed by simultaneously implanting dopants of the first conductivity type into the modulator semiconductor structure and the semiconductor contact structure at the first dose.

In one embodiment, the dopant concentration in the first conductivity type-doped modulator semiconductor portion 31 can be on the same order of magnitude as the dopant concentration in the first conductivity type-doped semiconductor contact portion 61. For example, the concentration of first conductivity type dopants in the first conductivity type-doped modulator semiconductor portion 31 can be from $1.0 \times 10^{16}/cm^3$ to $1.0 \times 10^{20}/cm^3$. In one embodiment, the concentration of first conductivity type dopants in the first conductivity type-doped modulator semiconductor portion 31 can be from $1.0 \times 10^{17}/cm^3$ to $1.0 \times 10^{19}/cm^3$.

In one embodiment, the sidewalls of the first conductivity type-doped semiconductor contact portion 61 can be spaced from the sidewalls of the first conductivity type-doped end portion 65 and the second conductivity type-doped end portion 66. If the portion 60 of the semiconductor contact structure (60, 65, 66) that excludes the first and second conductivity type-doped end portions (65, 66) is intrinsic at the end of the processing steps of FIG. 8, then a first intrinsic semiconductor contact portion 63 and a second intrinsic semiconductor contact portion 64 can be formed in the sub-portions of semiconductor contact structure at the processing step of FIG. 9. The first intrinsic semiconductor contact portion 63 is in lateral contact with the first-conductivity type end portion 65 and the first conductivity type-doped semiconductor contact portion 61. The second intrinsic semiconductor contact portion 64 is in lateral contact with the second conductivity type end portion 66 and the first conductivity type-doped semiconductor contact portion 61.

Referring to FIG. 10, a fourth ion implantation mask layer 77 can be formed and lithographically patterned to physically expose a portion of the first conductivity type-doped semiconductor contact portion 61. The fourth ion implantation mask layer 77 can be a photoresist layer. In one embodiment, the physically exposed portion of the selected portion of the first conductivity type-doped semiconductor contact portion 61 can be selected include a portion of, or laterally contact a sidewall of, the second intrinsic semiconductor contact portion 64.

Second conductivity type ions are implanted into the physically exposed portion of the first conductivity type-doped semiconductor contact portion 61. The implanted portion of the first conductivity type-doped semiconductor contact portion 61 is converted into a second conductivity type-doped semiconductor contact portion 62. The dose of the implanted second conductivity type ions is selected such that the second conductivity type-doped semiconductor contact portion 62 has a net doping of the second conductivity type. In other words, the number of second conductivity dopants in the second conductivity type-doped semiconductor contact portion 62 is greater than the number of first conductivity dopants in the second conductivity type-doped semiconductor contact portion 62. In one embodiment, the number of second conductivity dopants in the second conductivity type-doped semiconductor contact portion 62 can be about twice the number of first conductivity dopants in the second conductivity type-doped semiconductor contact portion 62.

The second conductivity type-doped semiconductor contact portion 62 is in lateral contact with the first conductivity type-doped semiconductor contact portion 61 upon formation. A lateral p-n junction is formed between the first conductivity type-doped semiconductor contact portion 61 and the second conductivity type-doped semiconductor contact portion 62. This lateral p-n junction is herein referred to as a second lateral p-n junction (to contrast with another p-n junction that is formed below the second p-n junction and described below). In one embodiment, the first conductivity type-doped semiconductor contact portion 61 can be a p-doped semiconductor contact portion and the second conductivity type-doped semiconductor contact portion 62 can be an n-doped semiconductor contact portion. In another embodiment, the first conductivity type-doped semiconductor contact portion 61 can be an n-doped semiconductor contact portion and the second conductivity type-doped semiconductor contact portion 62 can be a p-doped semiconductor contact portion.

In one embodiment, the net dopant concentration of second conductivity type dopants (i.e., the dopant concentration of the second conductivity type dopants less the dopant concentration of the first conductivity type dopants) in the second conductivity type-doped semiconductor contact portion 62 can be less than the dopant concentration in the second conductivity type-doped end portion 66. For example, the net dopant concentration of second conductivity type dopants in the second conductivity type-doped semiconductor contact portion 62 can be from $1.0 \times 10^{16}/cm^3$ to $1.0 \times 10^{20}/cm^3$. In one embodiment, the net dopant concentration of second conductivity type dopants in the second conductivity type-doped semiconductor contact portion 62 can be from $1.0\times10^{17}/cm^3$ to $1.0\times10^{19}/cm^3$.

In one embodiment, the energy of the ion implantation can be selected to deliver additional second conductivity type dopants into the portion of the first conductivity type-doped modulator semiconductor portion 31 underlying the opening in the fourth ion implantation mask layer 77. In this embodiment, dopants of the second conductivity type can be simultaneously implanted into the portion of the first conductivity type-doped modulator semiconductor portion 31 underlying the opening in the fourth ion implantation mask layer 77 at a second dose that is greater than the first dose employed to form the first conductivity type-doped modulator semiconductor portion 31. In one embodiment, the second dose can be about twice the first dose. The implanted portion of the first conductivity type-doped modulator semiconductor portion 31 is converted into a second conductivity type-doped modulator semiconductor portion 32 having a doping of the second conductivity type. In one embodiment, about one half of the modulator semiconductor structure can be a remaining portion of the first conductivity type-doped modulator semiconductor portion 31, and the rest can be the second conductivity type-doped modulator semiconductor portion 32. Thus, the second conductivity type-doped semiconductor contact portion 62 and the second conductivity type-doped modulator semiconductor portion 32 can be formed by simultaneously implanting dopants of the second conductivity type into a portion of the modulator semiconductor structure and into a portion of the semiconductor contact structure at the second dose that is greater than the first dose. In this case, the first lateral p-n junction and the second lateral p-n unction are simultaneously formed.

The second conductivity type-doped modulator semiconductor portion 32 is in lateral contact with the first conductivity type-doped modulator semiconductor portion 31 upon formation. Another lateral p-n junction is formed between the first conductivity type-doped modulator semiconductor portion 31 and the second conductivity type-doped modulator semiconductor portion 32. This lateral p-n junction is herein referred to as a second lateral p-n junction (to contrast with the second p-n junction between the first conductivity type-doped semiconductor contact portion 61 and the second conductivity type-doped semiconductor contact portion 62). In one embodiment, the first conductivity type-doped modulator semiconductor portion 31 can be a p-doped semiconductor contact portion and the second conductivity type-doped modulator semiconductor portion 32 can be an n-doped semiconductor contact portion. In another embodiment, the first conductivity type-doped modulator semiconductor portion 31 can be an n-doped semiconductor contact portion and the second conductivity type-doped modulator semiconductor portion 32 can be a p-doped semiconductor contact portion. The first p-n junction can extend throughout the entire length of the modulator semiconductor structure (31, 32), and be located in a vertical plane that is about halfway between the two lengthwise sidewalls of the modulator semiconductor structure (31, 32). The first lateral p-n junction and the second lateral p-n junction are within the same vertical plane.

In one embodiment, the net dopant concentration of the second conductivity type dopants in the second conductivity type-doped modulator semiconductor portion 32 can be on the same order of magnitude as the net dopant concentration in the second conductivity type-doped semiconductor contact portion 62. For example, the net dopant concentration of second conductivity type dopants in the second conductivity type-doped modulator semiconductor portion 32 can be from $1.0\times10^{16}/cm^3$ to $1.0\times10^{20}/cm^3$. In one embodiment, the net dopant concentration of second conductivity type dopants in the second conductivity type-doped modulator semiconductor portion 32 can be from $1.0\times10^{17}/cm^3$ to $1.0\times10^{19}/cm^3$.

In one embodiment, a sidewall of the second conductivity type-doped semiconductor contact portion 62 can be spaced from the second conductivity type-doped end portion 66. The second intrinsic semiconductor contact portion 64 can be in lateral contact with the second conductivity type end portion 66 and the second conductivity type-doped semiconductor contact portion 62.

In one embodiment, the dopant concentration in the first conductivity type-doped end portion 65 can be greater than the dopant concentration in the first conductivity type-doped semiconductor contact portion 61, and the dopant concentration in the second conductivity type-doped end portion 66 can be greater than the net dopant concentration of the second conductivity type dopants in the second conductivity type-doped semiconductor contact portion 62.

In one embodiment, the first conductivity type-doped end portion 65 is a p-doped end portion, the first conductivity type-doped semiconductor contact portion 61 can be a p-doped semiconductor contact portion, the second conductivity type-doped end portion 66 is an n-doped end portion, and the second conductivity type-doped semiconductor contact portion 62 can be an n-doped semiconductor contact portion. In another embodiment, the first conductivity type-doped end portion 65 is an n-doped end portion, the first conductivity type-doped semiconductor contact portion 61 can be an n-doped semiconductor contact portion, the second conductivity type-doped end portion 66 is a p-doped end portion, and the second conductivity type-doped semiconductor contact portion 62 can be a p-doped semiconductor contact portion.

The semiconductor contact structure (65, 63, 61, 62, 64, 66) is configured such that the p-type-doped end portion (either 65 or 66) located at a first end of the semiconductor contact structure is more proximal to the p-doped semiconductor contact portion (either 61 or 62) than to the n-doped semiconductor contact portion (either 62 or 61), and the n-type-doped end portion (either 66 or 65) located at a second end of the semiconductor contact structure that is more proximal to the n-doped semiconductor contact portion (either 62 or 61) than to the p-doped semiconductor contact portion (either 61 or 62).

Further, the semiconductor contact structure (65, 63, 61, 62, 64, 66) is configured such that an intrinsic semiconductor contact portion (either 63 or 64) is in lateral contact with the p-doped end portion (either 65 or 66) and the p-doped semiconductor contact portion (either 61 or 62), and another intrinsic semiconductor contact portion (either 64 or 63) in lateral contact with the n-doped end portion (either 66 or 65) and the n-doped semiconductor contact portion (either 62 or 61).

Figure 11A:
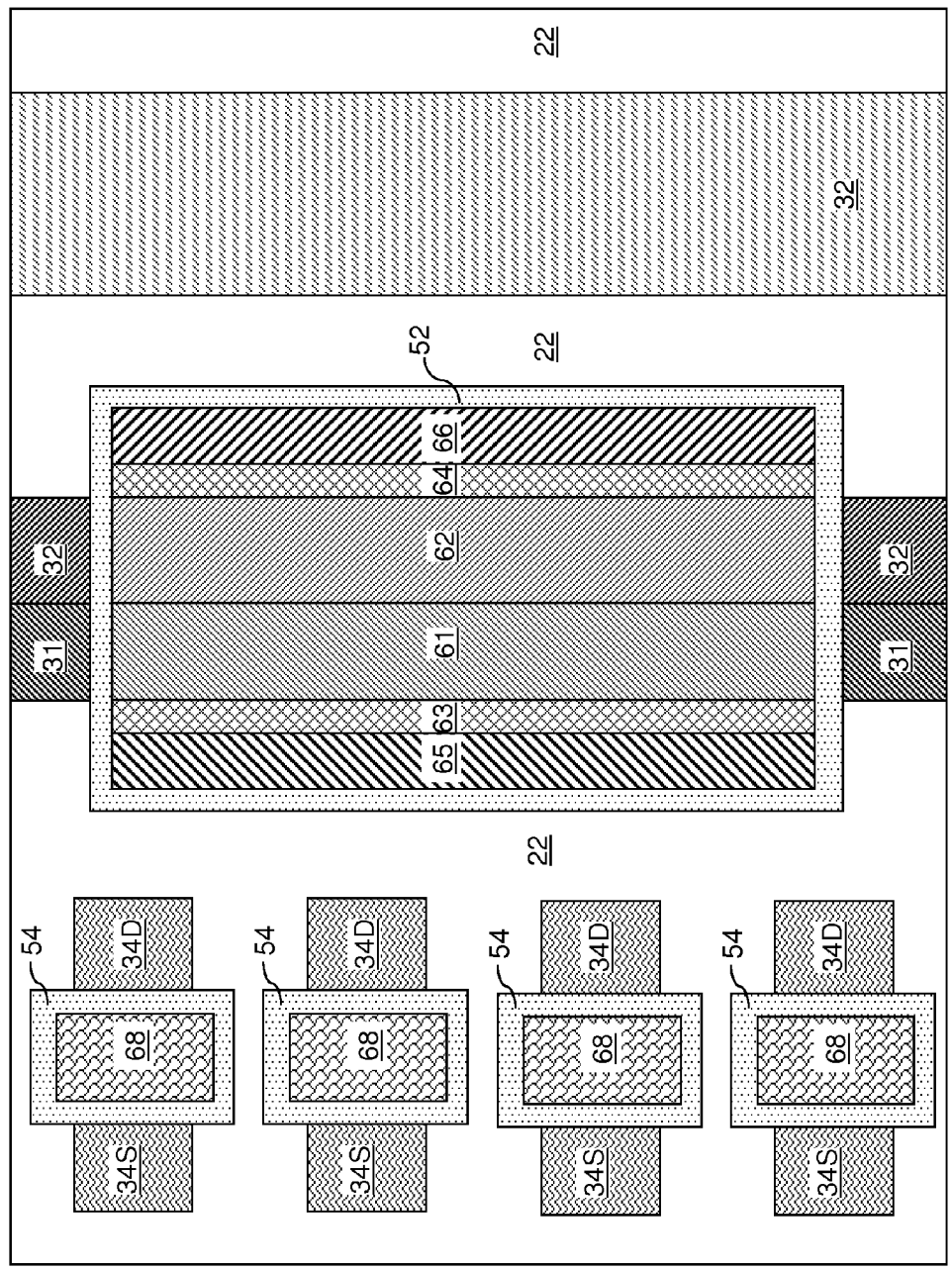
FIG. 11A is a top-down view of the first exemplary semiconductor structure of FIG. 11.

Referring to FIGS. 11 and 11A, the fourth ion implantation mask layer 77 is removed, for example, by ashing.

Referring to FIG. 12, a contact-level dielectric material layer 80 can be formed, for example, by chemical vapor deposition (CVD) or spin-coating. The contact-level dielectric material layer 80 includes a dielectric material such as a silicate glass, an organosilicate glass (OSG) material, a SiCOH-based low-k material formed by chemical vapor deposition, a spin-on glass (SOG), or a spin-on low-k dielectric material such as SiLK™, etc. The silicate glass includes an undoped silicate glass (USG), borosilicate glass (BSG), phosphosilicate glass (PSG), fluorosilicate glass (FSG), borophosphosilicate glass (BPSG), etc. The dielectric material may be a low dielectric constant (low-k) material having a dielectric constant less than 3.0. The dielectric material may non-porous or porous.

Various contact via holes are formed in the contact-level dielectric material layer 80, for example, by applying a photoresist layer (not shown), lithographically patterning the photoresist layer with holes overlying various device elements on the semiconductor substrate 8, and transferring the pattern in the patterned photoresist layer into the contact-level dielectric material layer 80 by an anisotropic etch. The patterned photoresist layer is subsequently removed, for example, by ashing.

The various contact via holes can include, for example, modulator contact via holes 85 that extend to the top surfaces of the first conductivity type-doped end portion 65 and the second conductivity type-doped end portion 66 and a gate contact via hole 87 that extend to the top surface of the gate electrode 68.

Figure 13:
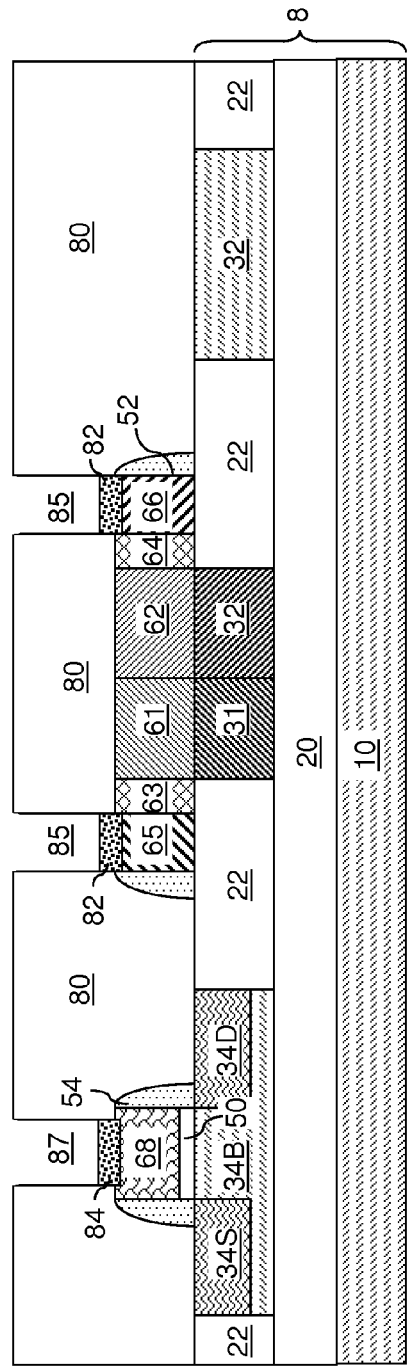
FIG. 13 is a vertical cross-sectional view of the first exemplary semiconductor structure after formation of various metal semiconductor alloy portions according to the first embodiment of the present disclosure.

Referring to FIG. 13, various metal semiconductor alloy portions are optionally formed on the physically exposed surfaces of the semiconductor materials at the bottom of each of the various contact via holes (85, 87). For example, modulator contact semiconductor alloy portions 82 can be formed at the bottom of the modulator contact via holes 85, and a gate metal semiconductor alloy portion 84 can be formed at the bottom of the gate contact via hole 87. The modulator contact semiconductor alloy portions 82 can including a first end metal semiconductor alloy portion in contact with a first portion (e.g., either 65 or 66) of the semiconductor contact structure located on one side of the second lateral p-n junction, and a second end metal semiconductor alloy portion in contact with a second portion (e.g., either 66 or 65) of the semiconductor contact structure located on another side of the second lateral p-n junction. In one embodiment, the modulator contact semiconductor alloy portions 82 and the gate metal semiconductor alloy portion 84 can have the same composition.

Figure 14:
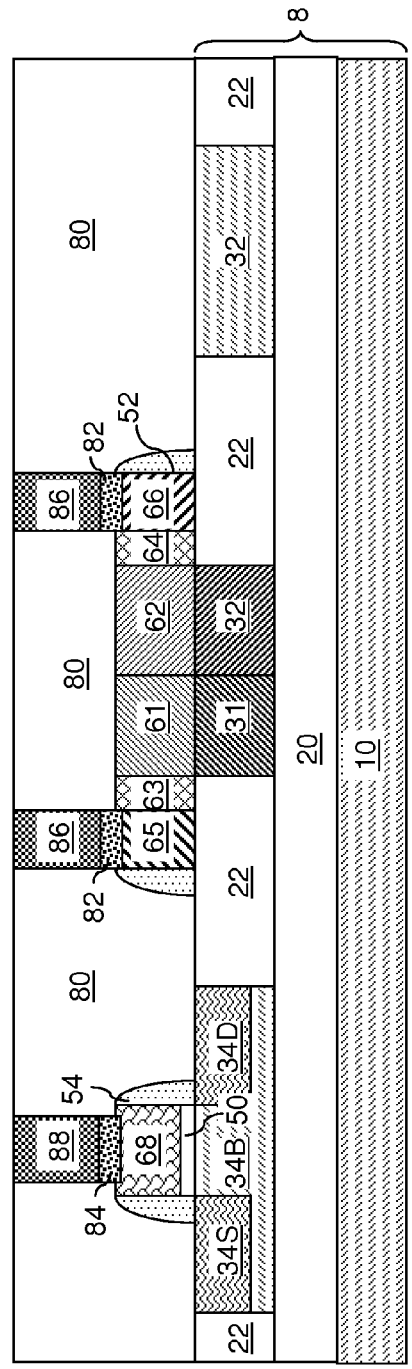
FIG. 14 is a vertical cross-sectional view of the first exemplary semiconductor structure after formation of various contact via structures according to the first embodiment of the present disclosure.

Referring to FIG. 14, various contact via structures are formed by filling the modulator contact via holes 85 and the bottom of the gate contact via hole 87 with a conductive material. For example, modulator contact via structures 86 can be formed in the modulator contact via holes 85, and a gate contact via structure 88 can be formed in the gate contact via hole 87. The modulator contact via structures 86 can include a first modulator contact via structure embedded in the contact-level dielectric layer 80 and in contact with the first end metal semiconductor alloy portion 65, and a second modulator contact via structure embedded in the contact-level dielectric layer 80 and in contact with the second end metal semiconductor alloy portion 66. The gate contact via structure 88 is embedded in the contact-level dielectric layer 80 and is in contact with the gate metal semiconductor alloy portion 84. The various contact via structures (86, 88) includes a conductive material such as doped polysilicon, a doped silicon-containing semiconductor material, W, Cu, Al, TaN, TiN, Ta, Ti, or a combination thereof.

The order of the masked ion implantation steps illustrated in FIGS. 7, 8, 9, and 10 can be exchanged, and the pattern of the various implantation masks can be adjusted provided that the resulting structure is the same as the structure illustrated in FIG. 14.

Further, the number of ion implantation steps and the boundary between the various implanted regions can be adjusted provided that a first lateral p-n junction is formed between the first conductivity type-doped modulator semiconductor portion 31 and the second conductivity type-doped modulator semiconductor portion 32, and a second lateral p-n junction is formed between the first conductivity type-doped semiconductor contact portion 61 and the second conductivity type-doped semiconductor contact portion 62.

FIG. 15 illustrates a second exemplary semiconductor structure, which can be derived from the first exemplary semiconductor structure by modifying the pattern of openings in the various ion implantation mask layers (71, 73, 75, 77) during the ion implantation steps. For example, the areas of the various ion implantation regions can be adjusted to eliminate the first intrinsic semiconductor contact portion 63 and the second intrinsic semiconductor contact portion 64. In this case, the first conductivity type-doped semiconductor contact portion 61 is in lateral contact with the first conductivity type end portion 65, and the second conductivity type-doped semiconductor contact portion 62 is in lateral contact with the second conductivity type end portion 66. Thus, a p-type-doped end portion (one of 65 and 66) is in lateral contact with a p-doped semiconductor contact portion (one of 61 and 62), and an n-type-doped end portion is in lateral contact with an n-doped semiconductor contact portion (one of 62 and 61).

FIG. 16 illustrates a third exemplary semiconductor structure, which can be derived from the first exemplary semiconductor structure by eliminating the steps for forming the first conductivity type end portion 65 and the second conductivity type end portion 66. Further, the areas of ion implantation for forming the first conductivity type-doped semiconductor contact portion 61 and the second conductivity type-doped semiconductor contact portion 62 are adjusted to include the entirety of each semiconductor contact structure. Thus, each semiconductor contact structure consists of a first conductivity type-doped semiconductor contact portion 61 and a second conductivity type-doped semiconductor contact portion 62. Consequently, each semiconductor contact structure consists of a p-doped semiconductor contact portion and an n-doped semiconductor contact portion.

FIG. 17 illustrates a fourth exemplary semiconductor structure, which can be derived from the first or second exemplary semiconductor structure by forming the first lateral p-n junction and the second lateral p-n junction at different processing steps, i.e., in two separate ion implantation steps employing two different ion implantation masks. In this case, a first vertical plane of the first lateral p-n junction can be laterally offset from a second vertical plane of the second lateral p-n junction.

FIG. 18 illustrates a fifth exemplary semiconductor structure, which can be derived from the third exemplary semiconductor structure by forming the first lateral p-n junction and the second lateral p-n junction at different processing steps, i.e., in two separate ion implantation steps employing two different ion implantation masks. In this case, a first vertical plane of the first lateral p-n junction can be laterally offset from a second vertical plane of the second lateral p-n junction.

Figure 19:
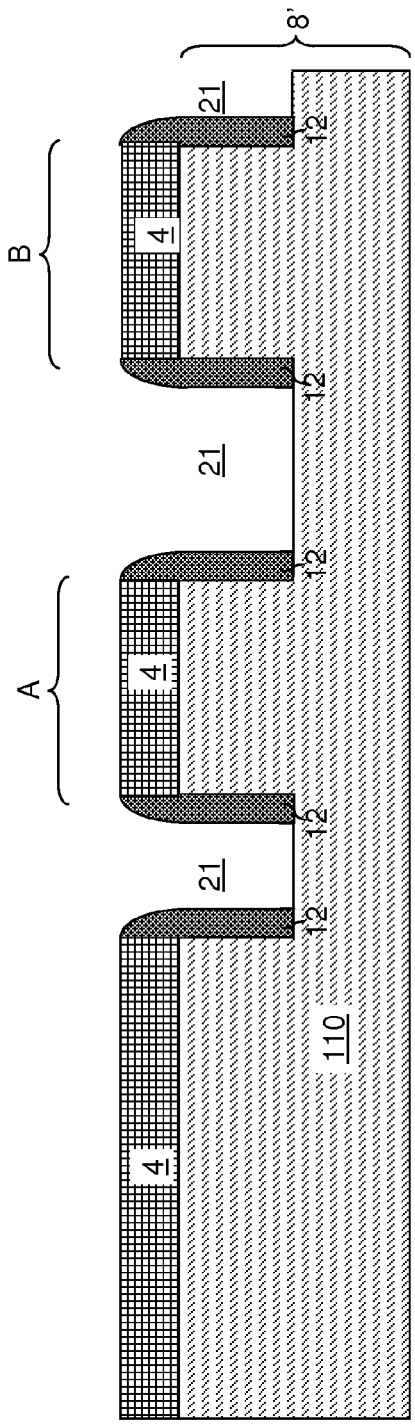
FIG. 19 is a vertical cross-sectional view of a sixth exemplary semiconductor structure after formation of at least one pad layer, first shallow trenches, and dielectric trench spacers according to a sixth embodiment of the present disclosure.

Referring to FIG. 19, a sixth exemplary semiconductor structure according to a sixth embodiment of the present disclosure is formed by employing a bulk semiconductor substrate for the semiconductor substrate 8'. The bulk semiconductor substrate 8' includes a semiconductor material layer 110, which can have the same composition and crystallinity as the top semiconductor layer of the semiconductor substrate 8 in the first embodiment.

At least one pad layer 4 including an oxygen-impermeable material is deposited and patterned to form openings therein. In one embodiment, the pattern of openings can include a pair of parallel lines spaced by the width of a modulator semiconductor structure to be subsequently formed, and another pair of parallel lines spaced by the width of a waveguide semiconductor structure to be subsequently formed. The oxygen-impermeable material can be, for example, silicon nitride. The pattern of the openings in the at least one pad layer 4 is transferred into an upper portion of the semiconductor material layer 110, for example, by an anisotropic etch to form first shallow trenches 21. The first shallow trenches 21 are line trenches that extend in a lengthwise direction, which is the direction perpendicular to the vertical cross-sectional view of FIG. 19. The depth of the first shallow trenches 21, as measured from the topmost surface of the semiconductor substrate 8' to the bottom surface of the first shallow trenches 21 can be from 50 nm to 2,000 nm, although lesser and greater depths can also be employed.

A semiconductor portion of the semiconductor substrate 8' that is laterally bound by a pair of the line trenches defines a first lateral extent A, which is the lateral extent of a modulator semiconductor structure to be subsequently formed. Another semiconductor portion of the semiconductor substrate 8' that is laterally bound by another pair of the line trenches can define a second lateral extent B, which is the lateral extent of a waveguide semiconductor structure to be subsequently formed.

Oxygen-impermeable dielectric spacers 12 are formed on sidewalls of the first shallow trenches 21 by depositing a conformal oxygen-impermeable dielectric material layer and removing horizontal portions of the conformal oxygen-impermeable dielectric material layer. The remaining vertical portions of the oxygen-impermeable dielectric material layer constitute the oxygen-impermeable dielectric spacers 12. The oxygen-impermeable dielectric spacers 12 include an oxygen-impermeable material such as silicon nitride. The lateral thickness of the oxygen-impermeable dielectric spacers 12 (as measured at the bottom portions) can be from 10 nm to 300 nm, although lesser and greater thicknesses can also be employed.

Figure 20:
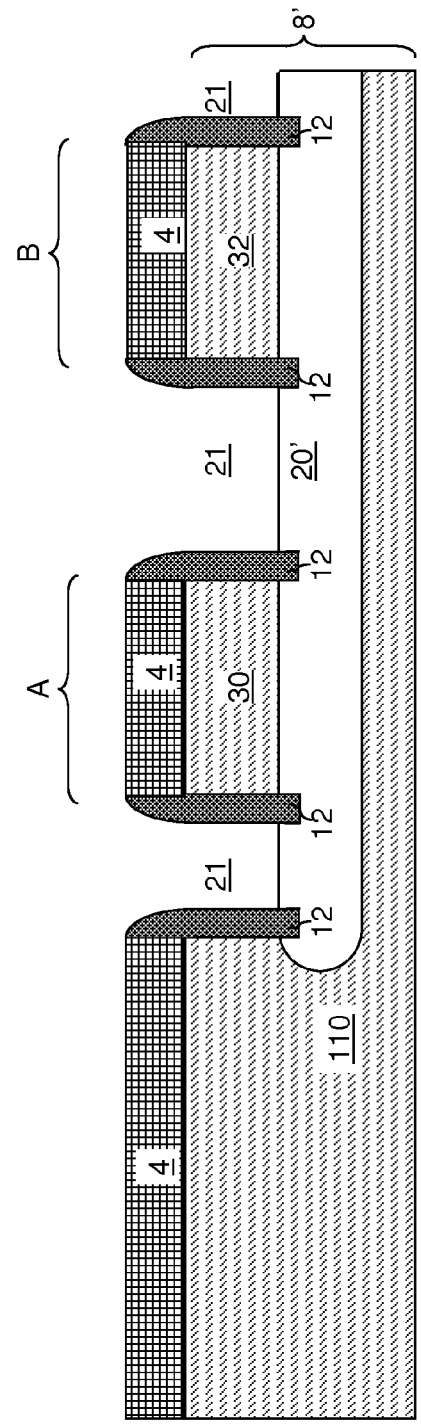
FIG. 20 is a vertical cross-sectional view of the sixth exemplary semiconductor structure after formation of a localized buried oxide layer according to the sixth embodiment of the present disclosure.

Referring to FIG. 20, a localized buried oxide layer 20' is formed by oxidizing a portion of the semiconductor substrate 8' from underneath the semiconductor portions that subsequently constitute the modulator semiconductor structure and the waveguide semiconductor structure. A remaining portion of the semiconductor substrate 8' located above the localized buried oxide layer 20' and within the first lateral extent A constitutes a modulator semiconductor structure 30. Another remaining portion of the semiconductor substrate 8' located above the localized buried oxide layer 20' and within the second lateral extent B constitutes a waveguide semiconductor structure 32.

Figure 21:
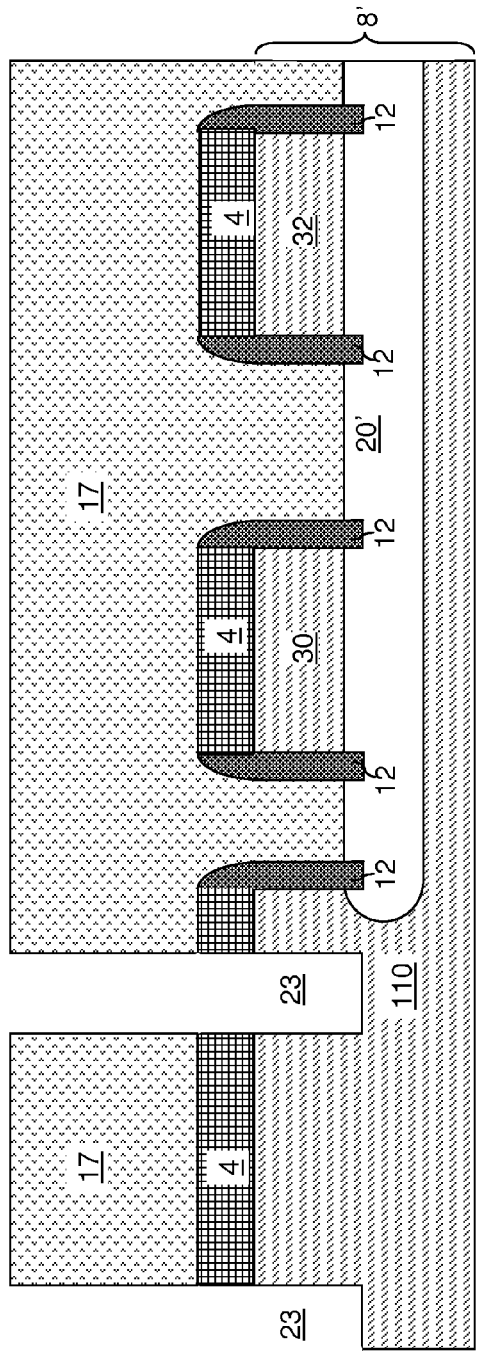
FIG. 21 is a vertical cross-sectional view of the sixth exemplary semiconductor structure after formation of second shallow trenches according to the sixth embodiment of the present disclosure.

Referring to FIG. 21, second shallow trenches 23 are formed in an upper portion of the semiconductor substrate 8'. For example, a photoresist layer 17 is applied over the sixth exemplary semiconductor structure and is lithographically patterned. The pattern in the photoresist layer 17 is transferred into the upper portion of the semiconductor substrate 8' to form the second shallow trenches 23, which define the area of at least one active region on which at least one field effect transistor is to be subsequently formed. The photoresist layer 17 is subsequently removed.

Figure 22:
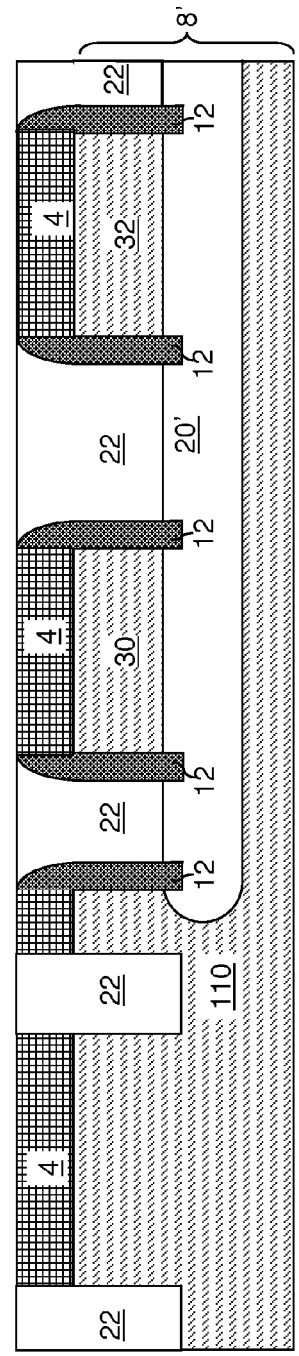
FIG. 22 is a vertical cross-sectional view of the sixth exemplary semiconductor structure after formation of shallow trench isolation structures according to the sixth embodiment of the present disclosure.

Referring to FIG. 22, a dielectric material such as silicon oxide is deposited into the first shallow trenches 21 and the second shallow trenches 23. The dielectric material is planarized, for example, by chemical mechanical planarization (CMP) that employs the at least one pad layer 4 as a stopping layer, to form shallow trench isolation structures 22.

Figure 23:
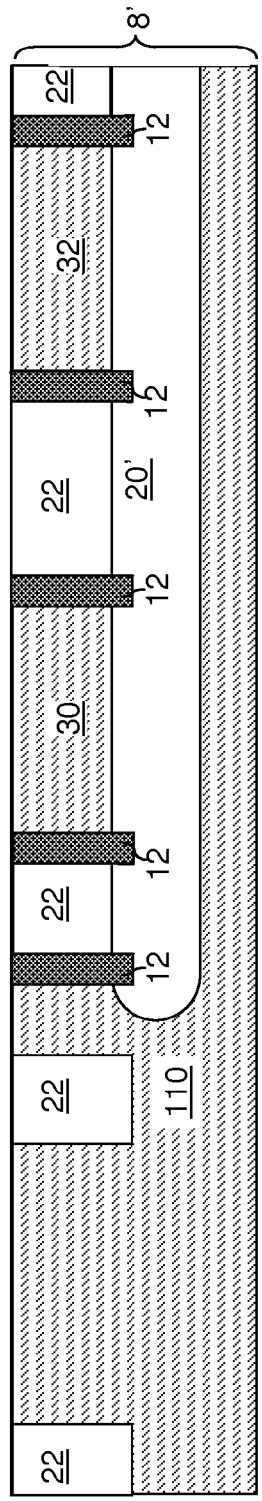
FIG. 23 is a vertical cross-sectional view of the sixth exemplary semiconductor structure after removal of the at least one pad layer and recessing of the shallow trench isolation structures according to the sixth embodiment of the present disclosure.

Referring to FIG. 23, the shallow trench isolation structures 22 are vertically recessed, and the at least one pad layer 4 is removed. The vertical recessing of the shallow trench isolation structures 22 can be effected, for example, by a wet etch. Further, the removal of the at least one pad layer 4 can be effected, for example, by another wet etch.

Figure 24:
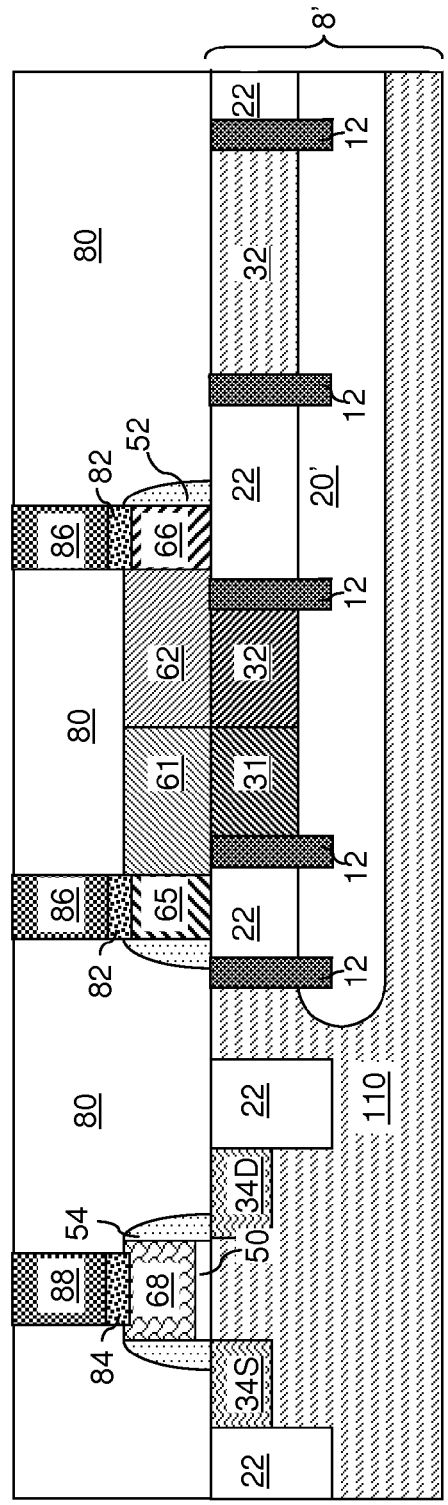
FIG. 24 is a vertical cross-sectional view of the sixth exemplary semiconductor structure after formation of a modulator semiconductor structure and a semiconductor contact structure employing a same semiconductor material as a gate electrode of a field effect transistor according to the sixth embodiment of the present disclosure.

Referring to FIG. 24, the processing steps of FIGS. 1-6, 6A, 7-11, 11A, and 12-14 with, or without, variations described in FIGS. 15-18 are performed to form a modulator semiconductor structure (31, 32) and a semiconductor contact structure (65, 61, 52, 66) employing the same semiconductor material as a gate electrode 68 of a field effect transistor. As discussed above, the semiconductor contact structure (65, 61, 52, 66) can include a single crystalline semiconductor material or a polycrystalline semiconductor material, and the gate electrode 68 includes a polycrystalline semiconductor material. The semiconductor contact structure (65, 61, 52, 66) and the gate electrode 68 have the same semiconductor composition. The bottom surface of the modulator semiconductor structure (31, 32) contacts a localized buried oxide layer 20'. The sidewalls of the modulator semiconductor structure (31, 32) contacts at least one oxygen-impermeable dielectric spacer 12 embedded within the semiconductor substrate 8'.

Figure 25:
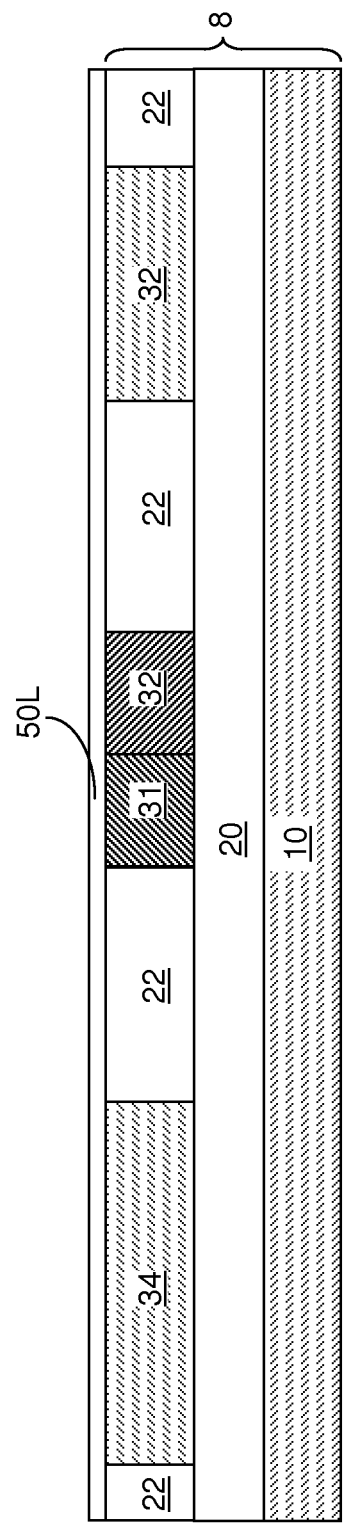
FIG. 25 is a vertical cross-sectional view of a seventh exemplary semiconductor structure after formation of a first lateral p-n junction between a p-doped modulator semiconductor portion and an n-doped modulator semiconductor portion within a modulator semiconductor structure according to a seventh embodiment of the present disclosure.

Referring to FIG. 25, a seventh exemplary semiconductor structure according to a seventh embodiment of the present disclosure is illustrated. In the seventh embodiment, the formation of a first lateral p-n junction between a p-doped modulator semiconductor portion (either 31 or 32) and an n-doped modulator semiconductor portion (either 32 or 31) within a modulator semiconductor structure (31, 32) can be performed prior to formation of the gate dielectric layer 50L or after formation of the gate dielectric layer 50L and prior to formation of the semiconductor material layer 60L (See FIG. 3). Processing steps of FIGS. 2-6, 6A, 7-11, 11A, and 12-14 with, or without, variations described in FIGS. 15-18 are performed to form a semiconductor contact structure employing the same semiconductor material as a gate electrode of a field effect transistor.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a semiconductor structure, said method comprising:
    forming a modulator semiconductor structure having a uniform width and a uniform thickness and having sidewalls and a bottom surface contacting at least one dielectric material in a semiconductor substrate;
    forming a first lateral p-n junction within said modulator semiconductor structure by forming a p-doped modulator semiconductor portion and an n-doped modulator semiconductor portion within said modulator semiconductor structure;
    forming a semiconductor contact structure over said semiconductor substrate and directly on said modulator semiconductor structure; and
    forming a second lateral p-n junction within said semiconductor contact structure by forming a p-doped semiconductor contact portion and an n-doped semiconductor contact portion within said semiconductor contact structure, wherein said p-doped semiconductor contact portion is in contact with said p-doped modulator semiconductor portion upon formation of said p-doped semiconductor contact portion, and said n-doped semiconductor contact portion is in contact with said n-doped modulator semiconductor portion upon formation of said n-doped semiconductor contact portion.

2. The method of claim 1, further comprising forming a field effect transistor including a gate electrode, wherein said method further comprises:
   forming a gate dielectric layer on a surface of an active region for said field effect transistor and said modulator semiconductor structure;
   removing a portion of said gate dielectric layer from above said modulator semiconductor structure while not removing said gate dielectric layer from above said active region.

3. The method of claim 2, further comprising:
   depositing a semiconductor material layer directly on said gate dielectric layer and a surface of said modulator semiconductor structure; and
   patterning said semiconductor material layer to form said gate electrode and said semiconductor contact structure.

4. The method of claim 3, wherein said depositing of said semiconductor material layer comprises depositing a polycrystalline semiconductor material, wherein said gate electrode and said semiconductor contact structure comprise said polycrystalline semiconductor material.

5. The method of claim 3, wherein said depositing of said semiconductor material layer comprises depositing an amorphous semiconductor material and said modulator semiconductor structure comprises a first single crystalline semiconductor material, and said method further comprises converting a portion of said amorphous semiconductor material into a second single crystalline semiconductor material in epitaxial alignment with said first single crystalline semiconductor material.

6. The method of claim 2, further comprising:
   forming a dielectric gate spacer around said gate electrode; and
   forming a dielectric spacer comprising a same material as said dielectric gate spacer around said semiconductor contact structure concurrently with formation of said dielectric gate spacer.

7. The method of claim 2, further comprising:
   forming a first end metal semiconductor alloy portion directly on a first portion of said semiconductor contact structure located on one side of said second lateral p-n junction;
   forming a second end metal semiconductor alloy portion directly on a second portion of said semiconductor contact structure located on another side of said second lateral p-n junction; and
   forming a gate metal semiconductor alloy portion directly on said gate electrode, wherein said first end metal semiconductor alloy portion, said second end metal semiconductor alloy portion, and said gate metal semiconductor alloy portion have a same composition.

8. The method of claim 7, further comprising:
   forming a contact-level dielectric material layer over said semiconductor substrate;
   forming a first modulator contact via structure in said contact-level dielectric layer and directly on said first end metal semiconductor alloy portion;
   forming a second modulator contact via structure in said contact-level dielectric layer and directly on said second end metal semiconductor alloy portion; and
   forming a gate contact via structure in said contact-level dielectric layer and directly on said gate metal semiconductor alloy portion.

9. The method of claim 2, further comprising removing a portion of said gate dielectric layer from above a top surface of said modulator semiconductor structure prior to said forming of said semiconductor contact structure.

10. The method of claim 9, further comprising:
    simultaneously forming an epitaxial semiconductor material portion directly on said modulator semiconductor structure and a polycrystalline semiconductor material portion directly on a remaining portion of said gate dielectric layer; and
    patterning said epitaxial semiconductor material portion, wherein a remaining portion of said epitaxial semiconductor material portion is said semiconductor contact structure.

11. The method of claim 9, wherein said forming of said semiconductor contact structure comprises:
    depositing a polycrystalline semiconductor material layer on said modulator semiconductor structure and a remaining portion of said gate dielectric layer; and
    patterning said polycrystalline semiconductor material layer, wherein a portion of said patterned polycrystalline semiconductor material layer is said semiconductor contact structure.

12. The method of claim 1, further comprising:
    forming a p-type-doped end portion at a first end of said semiconductor contact structure that is more proximal to said p-doped semiconductor contact portion than to said n-doped semiconductor contact portion; and
    forming an n-type-doped end portion at a second end of said semiconductor contact structure that is more proximal to said n-doped semiconductor contact portion than to said p-doped semiconductor contact portion.

13. The method of claim 12, further comprising:
    forming an intrinsic semiconductor contact portion in lateral contact with said p-doped end portion and said p-doped semiconductor contact portion; and
    forming another intrinsic semiconductor contact portion in lateral contact with said n-doped end portion and said n-doped semiconductor contact portion.

14. The method of claim 1, wherein said forming of said first lateral p-n junction comprises:
    converting at least a portion of said modulator semiconductor structure into a first conductivity type-doped modulator semiconductor portion having a doping of a first conductivity type; and
    converting a sub-portion of said first conductivity type-doped modulator semiconductor portion into a second conductivity type-doped modulator semiconductor portion, wherein said second conductivity type is the opposite of said first conductivity type, and an interface between a remaining portion of said first conductivity type-doped modulator semiconductor portion and said second conductivity type-doped modulator semiconductor portion is said first p-n junction.

15. The method of claim 14, wherein said converting of said sub-portion of said first conductivity type-doped modulator semiconductor portion comprises:
    forming an ion implantation mask layer over a surface of said first conductivity type-doped modulator semiconductor portion, wherein a vertical sidewall of said ion implantation mask layer is parallel to a sidewall of said modulator semiconductor structure along a lengthwise direction of said modulator semiconductor structure; and
    implanting dopants of said second conductivity type through physically exposed surfaces of said first conductivity type-doped modulator semiconductor portion.

16. The method of claim 1, further comprising forming a waveguide semiconductor structure within said semiconductor substrate, wherein said waveguide structure comprises a same semiconductor material as said modulator semiconductor structure, has a same thickness as said modulator semiconductor structure, has a same width as said modulator semiconductor structure, and does not include a p-n junction therein.

17. The method of claim 1, wherein said first lateral p-n junction and said second lateral p-n junction are formed by:
   simultaneously implanting dopants of a first conductivity type into said modulator semiconductor structure and said semiconductor contact structure at a first dose; and
   simultaneously implanting dopants of a second conductivity type that is the opposite of said first conductivity type into a portion of said modulator semiconductor structure and into a portion of said semiconductor contact structure at a second dose that is greater than said first dose, wherein said first lateral p-n junction and said second lateral p-n junction are simultaneously formed.

18. The method of claim 1, wherein said forming of said first lateral p-n junction is performed prior to said forming of said semiconductor contact structure over said semiconductor substrate and directly on said modulator semiconductor structure.

19. The method of claim 1, further comprising forming a pair of shallow trench isolation structures that are laterally spaced by a width of said modulator semiconductor structure in said semiconductor substrate, wherein said sidewalls of said modulator semiconductor structure contacts said pair of shallow trench isolation structures.

20. The method of claim 1, further comprising:
   forming line trenches within said semiconductor substrate, wherein a semiconductor portion of said semiconductor substrate laterally bound by a pair of said line trenches defines a lateral extent of said modulator semiconductor structure;
   forming oxygen-impermeable dielectric spacers on sidewalls of said line trenches; and
   oxidizing said semiconductor substrate from underneath said semiconductor portion to form a localized buried oxide layer, wherein a remaining portion of said semiconductor portion forms said modulator semiconductor structure.

\* \* \* \* \*